United States Patent
Takada et al.

(10) Patent No.: US 12,001,687 B2
(45) Date of Patent: Jun. 4, 2024

(54) MEMORY SYSTEM

(71) Applicant: Kioxia Corporation, Tokyo (JP)

(72) Inventors: Marie Takada, Yokohama Kanagawa (JP); Masanobu Shirakawa, Chigasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 88 days.

(21) Appl. No.: 17/942,541

(22) Filed: Sep. 12, 2022

(65) Prior Publication Data

US 2023/0259287 A1    Aug. 17, 2023

(30) Foreign Application Priority Data

Feb. 17, 2022   (JP) .................................. 2022-023110

(51) Int. Cl.
   *G06F 3/06*    (2006.01)
   *G06F 11/10*   (2006.01)

(52) U.S. Cl.
   CPC ............ *G06F 3/0619* (2013.01); *G06F 3/064* (2013.01); *G06F 3/0653* (2013.01); *G06F 3/0679* (2013.01); *G06F 11/1068* (2013.01)

(58) Field of Classification Search
   None
   See application file for complete search history.

(56) References Cited

U.S. PATENT DOCUMENTS

| | | | |
|---|---|---|---|
| 10,592,134 B1 | 3/2020 | Goss et al. | |
| 10,649,844 B2* | 5/2020 | Ide | G11C 29/52 |
| 11,404,127 B1* | 8/2022 | Kumar | G11C 16/3495 |
| 2010/0238724 A1* | 9/2010 | Fukuda | G11C 16/0408 365/189.05 |
| 2017/0162271 A1 | 6/2017 | Yang | |
| 2018/0091170 A1* | 3/2018 | Asami | G11C 11/5642 |
| 2020/0075110 A1* | 3/2020 | Suzuki | G11C 16/30 |
| 2020/0218473 A1* | 7/2020 | Takada | G11C 16/0483 |
| 2020/0301778 A1* | 9/2020 | Kurose | G11C 16/26 |
| 2021/0217465 A1 | 7/2021 | Jung et al. | |
| 2021/0295941 A1* | 9/2021 | Asami | G11C 16/10 |
| 2022/0093169 A1* | 3/2022 | Asami | G11C 11/40615 |

OTHER PUBLICATIONS

Y. Di, L. Shi, C. Gao, Q. Li, C. J. Xue and K. Wu, "Minimizing Retention Induced Refresh Through Exploiting Process Variation of Flash Memory," in IEEE Transactions on Computers, vol. 68, No. 1, pp. 83-98, Jan. 1, 2019, doi: 10.1109/TC.2018.2858771. (Year: 2019).*

* cited by examiner

*Primary Examiner* — Daniel F. McMahon

(74) *Attorney, Agent, or Firm* — Maier & Maier, PLLC

(57) ABSTRACT

According to one embodiment, a memory system includes a nonvolatile memory including a plurality of blocks each including a plurality of cell units, each of the cell units including a plurality of memory cells; and a memory controller. The memory controller is configured to read second data from a second cell unit in a first block in response to first data being written in a first cell unit in the first block, and reserve refresh processing for the first block when the second data satisfies a condition.

16 Claims, 14 Drawing Sheets

| Number | VA | VB | ... | VG |
|---|---|---|---|---|
| 0 | $\Delta VA_0$ | $\Delta VB_0$ | ... | $\Delta VG_0$ |
| 1 | $\Delta VA_1$ | $\Delta VB_1$ | ... | $\Delta VG_1$ |
| ... | ... | ... | ... | ... |
| nmax-1 | $\Delta VA_{nmax-1}$ | $\Delta VB_{nmax-1}$ | ... | $\Delta VG_{nmax-1}$ |
F I G. 6
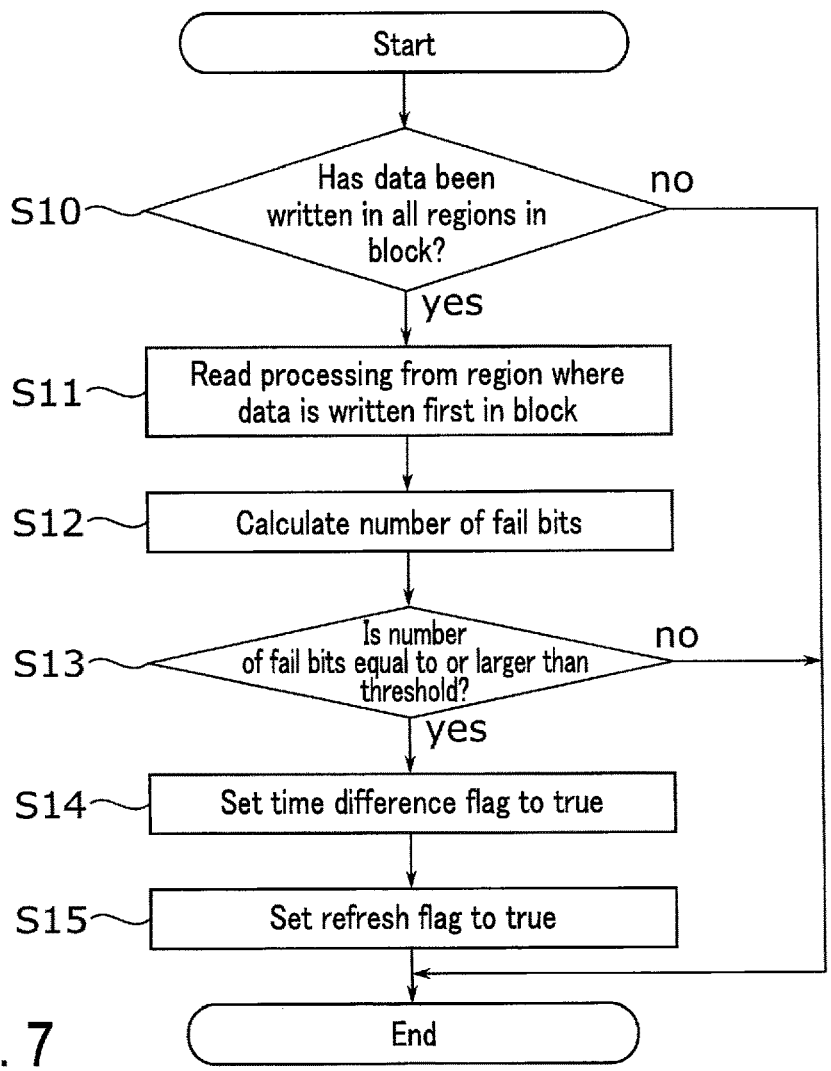
F I G. 7

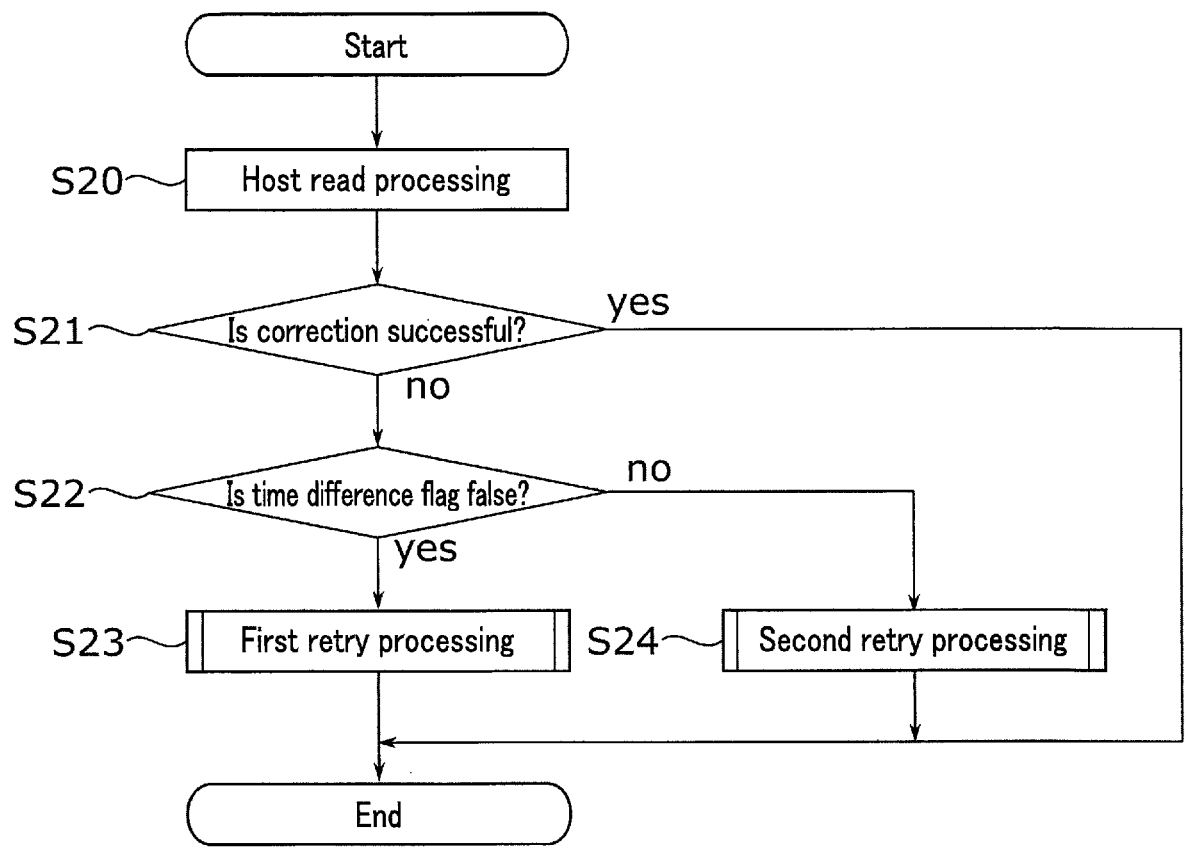
F I G. 8

| | Refresh flag | Time difference flag | Anchor ID | Head ID | Tail ID |
|---|---|---|---|---|---|
| BLK0 | true | true | 9 | 3 | 8 |
| BLK1 | true | false | 3 | - | - |
| BLK2 | false | false | 4 | - | - |
| BLK3 | false | false | 5 | - | - |

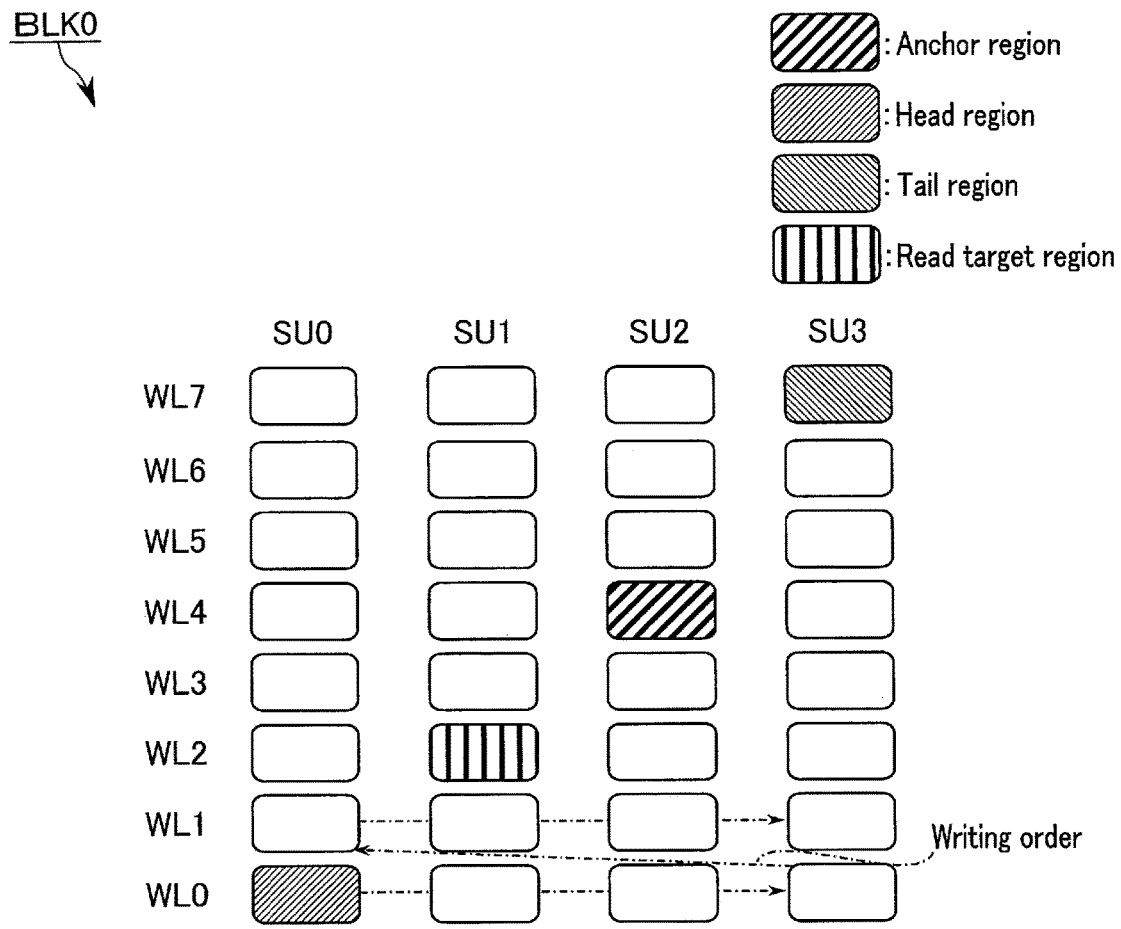
F I G. 18
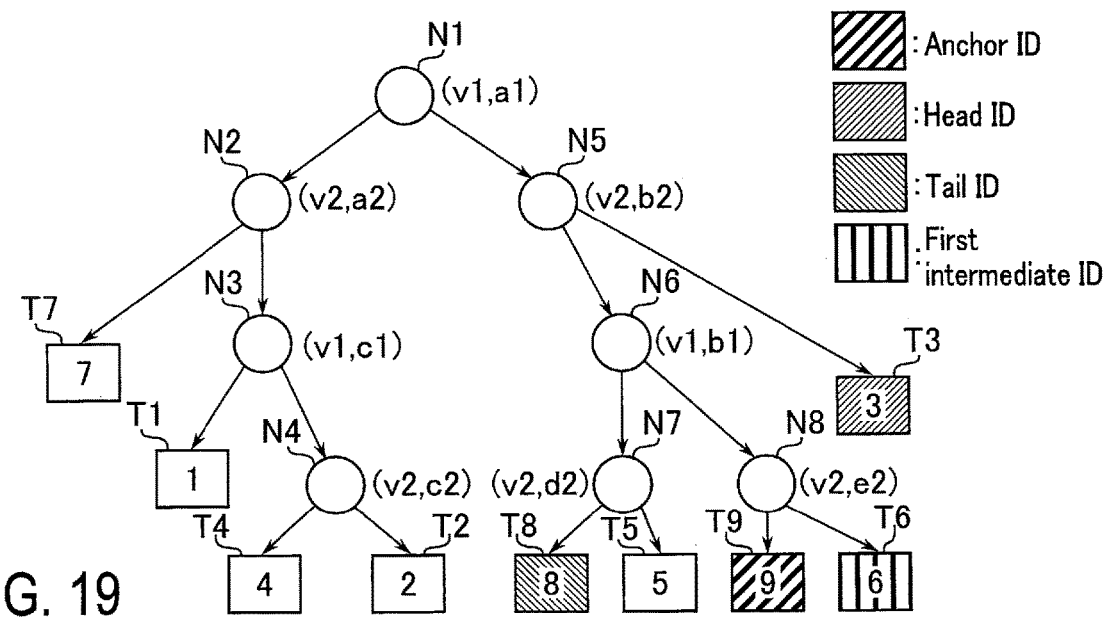
F I G. 19

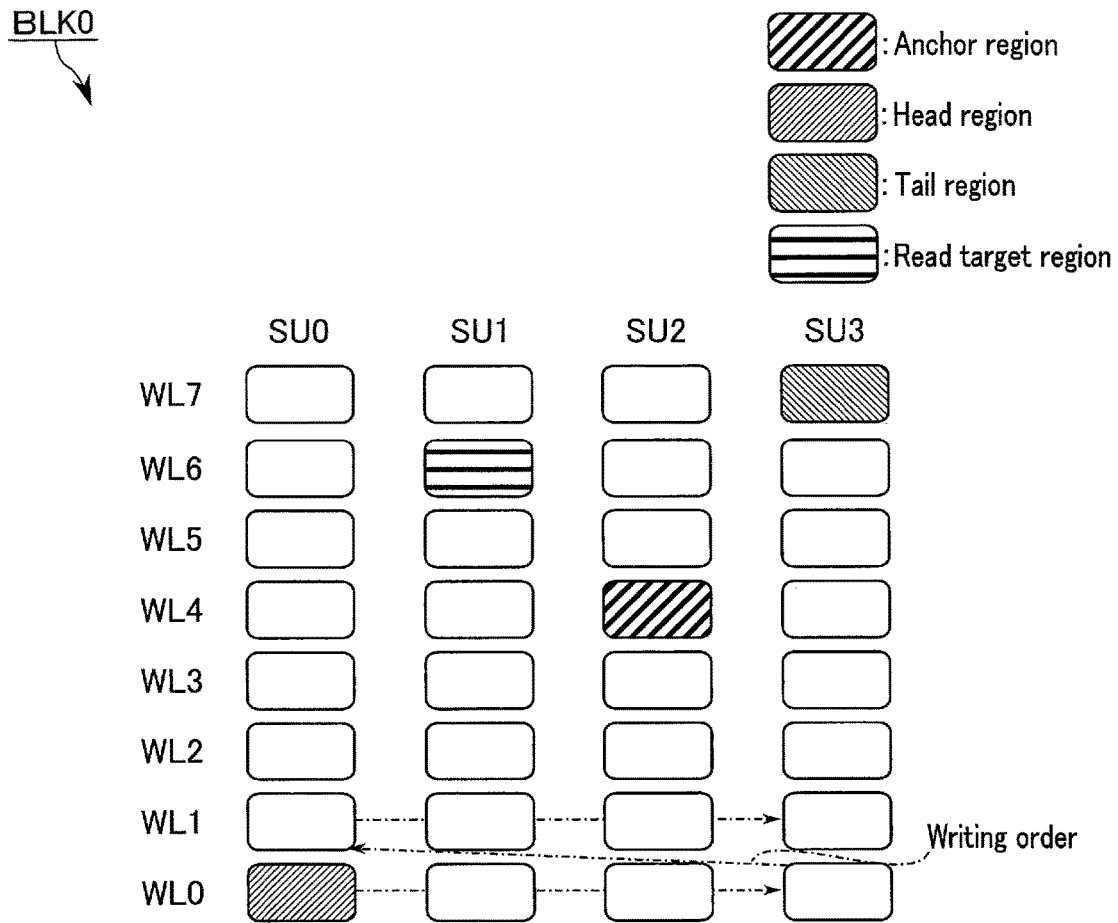
F I G. 20
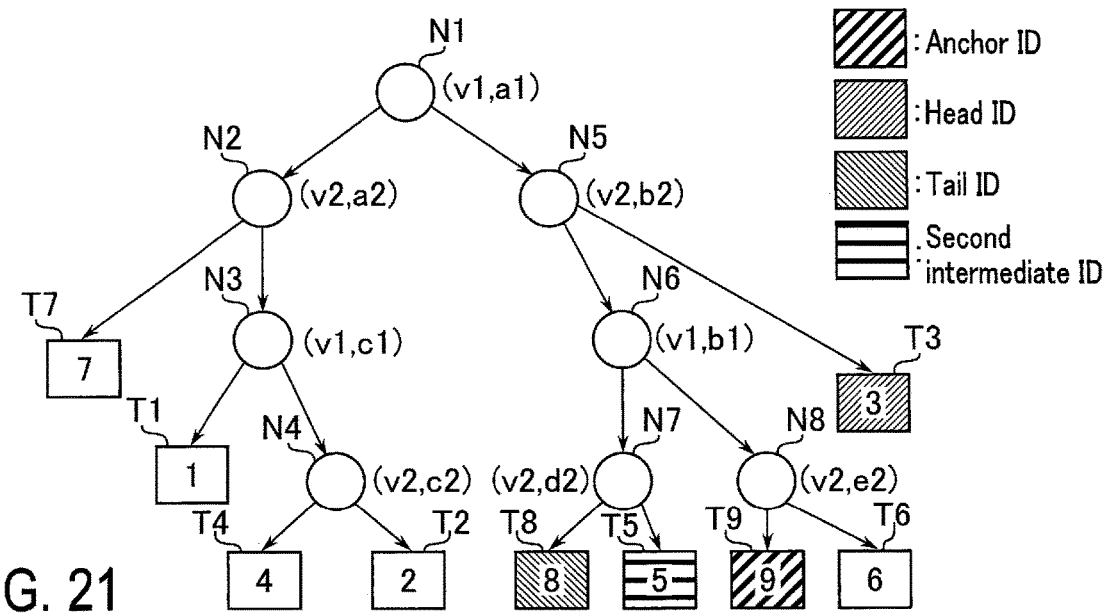
F I G. 21

MEMORY SYSTEM

CROSS-REFERENCE TO RELATED APPLICATIONS

This application is based upon and claims the benefit of priority from Japanese Patent Application No. 2022-023110, filed Feb. 17, 2022, the entire contents of which are incorporated herein by reference.

FIELD

Embodiments described herein relate generally to a memory system.

BACKGROUND

A memory system including a NAND flash memory functioning as a nonvolatile memory and a memory controller that controls the nonvolatile memory is known. The memory controller writes data in the nonvolatile memory in response to a request from a host device.

BRIEF DESCRIPTION OF THE DRAWINGS

FIG. 6 is a diagram illustrating a configuration of shift amount information of the memory system according to the first embodiment.

FIG. 7 is a flowchart illustrating an example of block management processing in the memory system according to the first embodiment.

FIG. 8 is a flowchart illustrating an example of a series of processing including host read processing in the memory system according to the first embodiment.

FIG. 18 is a diagram illustrating a relation among a read target region, an anchor region, a head region, and a tail region in a first example of the second retry processing in the memory system according to the second embodiment.

FIG. 19 is a diagram illustrating a relation among an intermediate ID, an anchor ID, a head ID, and a tail ID used in the first example of the second retry processing in the memory system according to the second embodiment.

FIG. 20 is a diagram illustrating a relation among a read target region, an anchor region, a head region, and a tail region in a second example of the second retry processing in the memory system according to the second embodiment.

FIG. 21 is a diagram illustrating a relation among an intermediate ID, an anchor ID, a head ID, and a tail ID used in the second example of the second retry processing in the memory system according to the second embodiment.

DETAILED DESCRIPTION

Figure 1:
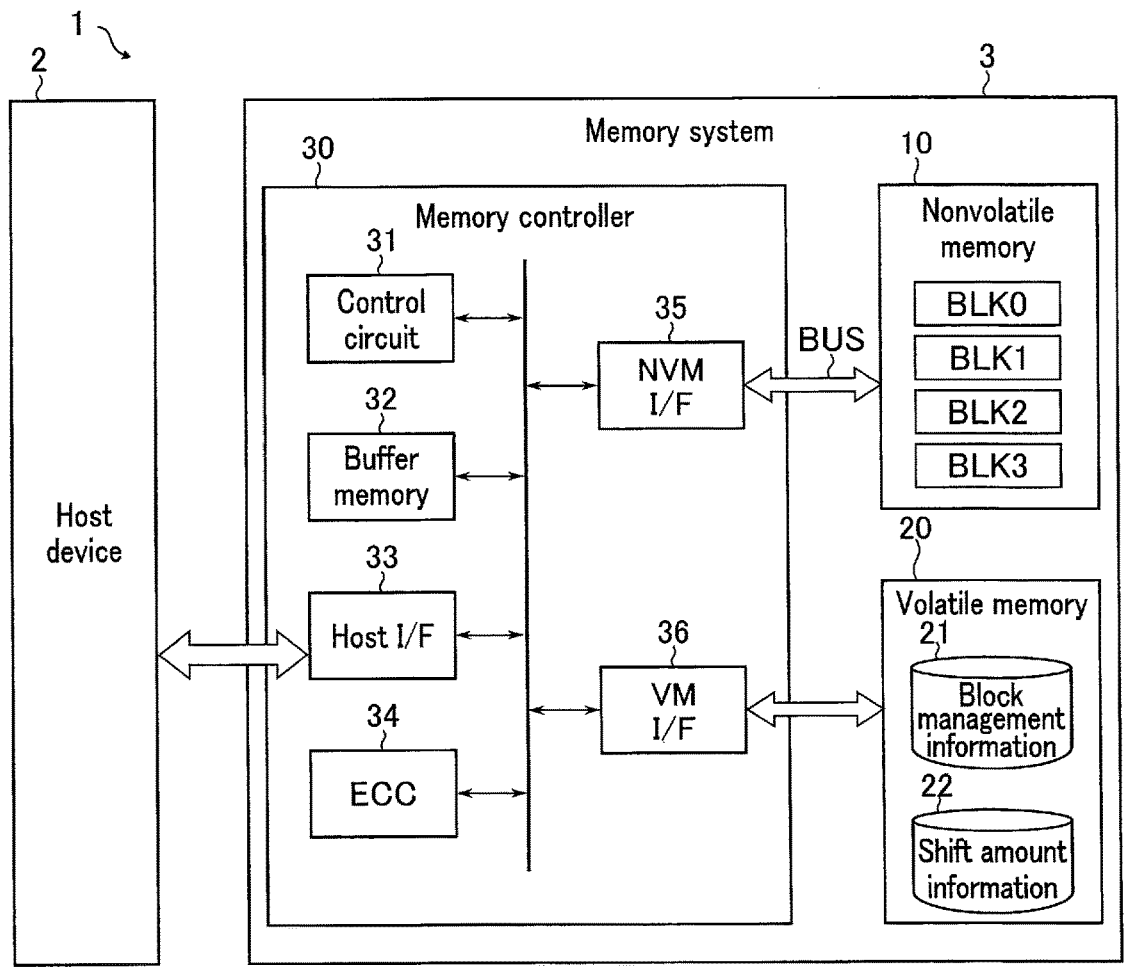
FIG. 1 is a block diagram illustrating an example of a configuration of an information processing system according to a first embodiment.

In general, according to one embodiment, a memory system includes a nonvolatile memory including a plurality of blocks each including a plurality of cell units, each of the cell units including a plurality of memory cells; and a memory controller. The memory controller is configured to read second data from a second cell unit in a first block in response to first data being written in a first cell unit in the first block, and reserve refresh processing for the first block when the second data satisfies a condition.

Embodiments are explained below with reference to the drawings. In the following description, components having the same functions and configurations are denoted by common reference numerals and signs. When a plurality of components having common reference numerals and signs are distinguished, the components are distinguished by adding suffixes to the common reference numerals and signs. Note that, when a plurality of components does not need to be particularly distinguished, only common reference numerals and signs are attached to the components and no suffixes are added to the reference numerals and signs.

1. First Embodiment

1.1 Configuration

1.1.1 Information Processing System

A configuration of an information processing system according to a first embodiment is described.

1.1.1 Memory System

FIG. 1 is a block diagram illustrating a configuration of the information processing system according to the first embodiment. As illustrated in FIG. 1, an information processing system 1 includes a host device 2 and a memory system 3.

The host device 2 is a data processing device that processes data using the memory system 3. The host device 2 is, for example, a personal computer or a server in a data center.

The memory system 3 is a storage device configured to be connected to the host device 2. The memory system 3 is, for example, a memory card such as an SD™ card, a UFS (Universal Flash Storage), or an SSD (Solid State Drive). The memory system 3 executes write processing, read processing, and erase processing for data in response to a request (command) from the host device 2. The memory system 3 may execute the write processing, the read processing, and the erase processing as internal processing.

1.1.2 Memory System

An internal configuration of the memory system according to the first embodiment is explained.

The memory system 3 includes a nonvolatile memory 10, a volatile memory 20, and a memory controller 30.

The nonvolatile memory 10 is, for example, a NAND flash memory. The nonvolatile memory 10 includes a plurality of blocks BLK (BLK0 to BLK3). Each of the blocks BLK includes a plurality of memory cell transistors each of which stores data in a nonvolatile manner. Each of the blocks BLK is, for example, a data erasing unit.

The volatile memory 20 is, for example, a DRAM (Dynamic Random Access Memory). The volatile memory 20 stores block management information 21 and shift amount information 22. Details of the block management information 21 and the shift amount information 22 are explained below.

The memory controller 30 is configured by an integrated circuit such as a SoC (System-on-a-Chip). The memory controller 30 controls the nonvolatile memory 10 based on a request (a host request) from the host device 2.

Specifically, for example, the memory controller 30 writes write data in the nonvolatile memory 10 based on a write request (a host write request) from the host device 2. The memory controller 30 reads read data from the nonvolatile memory 10 based on a read request (a host read request) from the host device 2. The memory controller 30 transmits data based on the read data to the host device 2.

1.1.3 Memory Controller

Subsequently, an internal configuration of the memory controller 30 is explained with reference to FIG. 1. The memory controller 30 includes a control circuit 31, a buffer memory 32, a host interface circuit (host I/F) 33, an ECC (Error Correction and Check) circuit 34, a nonvolatile memory interface circuit (NVM I/F) 35, and a volatile memory interface circuit (VM I/F) 36. Functions of the units 31 to 36 of the memory controller 30 explained below can be realized by either a hardware configuration or a combined configuration of hardware resources and firmware.

The control circuit 31 is a circuit that controls the entire memory controller 30. The control circuit 31 includes, for example, a processor such as a CPU (Central Processing Unit) and a ROM (Read Only Memory).

The buffer memory 32 is, for example, an SRAM (Static Random Access Memory). The buffer memory 32 buffers data between the host device 2 and the nonvolatile memory 10. The buffer memory 32 temporarily stores write data and read data.

The host interface circuit 33 manages communication between the memory controller 30 and the host device 2. The host interface circuit 33 is connected to the host device 2 via a host bus. The host bus conforms to, for example, an SD™ interface, an SAS (Serial Attached SCSI (Small Computer System Interface)), an SATA (Serial ATA (Advanced Technology Attachment), or a PCIe™ (Peripheral Component Interconnect express).

The ECC circuit 34 performs error detection processing and error correction processing concerning data stored in the nonvolatile memory 10. That is, when write processing is executed, the ECC circuit 34 adds an error correction code to write data. When read processing is executed, the ECC circuit 34 decodes read data and detects the presence or absence of a fail bit. The fail bit is a bit different from data written in the memory cell transistors among data (bit strings) read from the memory cell transistors. If a fail bit is detected, the ECC circuit 34 specifies a column address of the fail bit and performs error correction.

The nonvolatile memory interface circuit 35 manages communication between the nonvolatile memory 10 and the memory controller 30. The nonvolatile memory interface circuit 35 is connected to the nonvolatile memory 10 via a memory bus BUS. The memory bus BUS conforms to, for example, an SDR (single data rate) interface, a toggle DDR (double data rate) interface, or an ONFI (Open NAND flash interface).

The volatile memory interface circuit 36 manages communication between the volatile memory 20 and the memory controller 30. A bus that connects the volatile memory 20 and the memory controller 30 conforms to, for example, the DRAM interface standard.

1.1.4 Memory Bus

Figure 2:
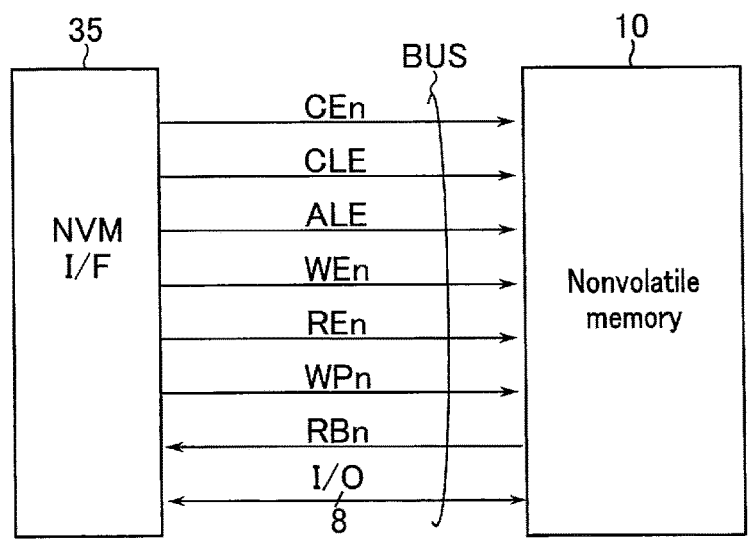
FIG. 2 is a block diagram illustrating an example of a signal communicated through a memory bus according to the first embodiment.

Subsequently, an example of signals exchanged between the nonvolatile memory 10 and the memory controller 30 are explained. FIG. 2 is a block diagram illustrating an example of signals communicated through the memory bus according to the first embodiment.

Signals used in the memory bus BUS include, for example, a chip enable signal CEn, a command latch enable signal CLE, an address latch enable signal ALE, a write enable signal WEn, a read enable signal REn, a write protect signal WPn, a ready/busy signal RBn, and an input/output signal I/O. In this specification, n at the end of a name of a signal means that the signal is asserted when the signal is at an "L (Low)" level.

The chip enable signal CEn is a signal for enabling the nonvolatile memory 10.

The command latch enable signal CLE and the address latch enable signal ALE are signals for notifying the nonvolatile memory 10 that input signals I/O to the nonvolatile memory 10 are respectively a command and an address.

The write enable signal WEn is a signal for causing the nonvolatile memory 10 to take in the input signal I/O.

The read enable signal REn is a signal for reading an output signal I/O from the nonvolatile memory 10.

The write protect signal WPn is a signal for instructing the nonvolatile memory 10 to prohibit writing and erasing of data.

The ready/busy signal RBn is a signal indicating whether the nonvolatile memory 10 is in a ready state or a busy state. The ready state is a state in which the nonvolatile memory 10 can receive a command from the memory controller 30. The busy state is a state in which the nonvolatile memory 10 cannot receive a command from the memory controller 30. In the ready/busy signal RBn, an "L" level indicates a busy state.

The input/output signal I/O is, for example, an 8-bit signal. The input/output signal I/O is an entity of data transmitted and received between the nonvolatile memory 10 and the memory controller 30. The input/output signal I/O includes a command, an address, and data such as write data and read data.

1.1.5 Nonvolatile Memory

Figure 3:
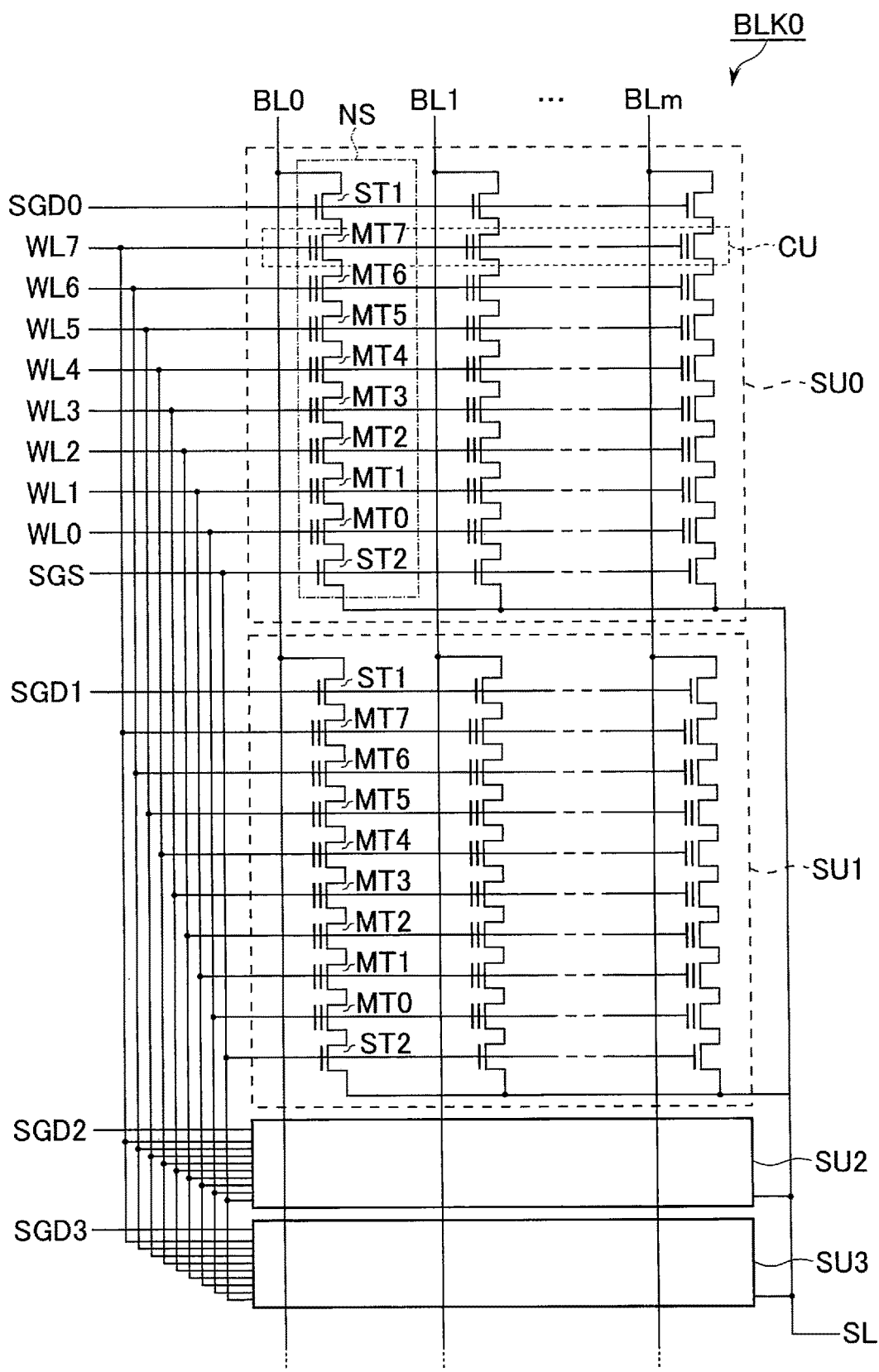
FIG. 3 is a circuit diagram illustrating an example of a configuration of a nonvolatile memory according to the first embodiment.

Subsequently, an internal configuration of the nonvolatile memory 10 is explained. FIG. 3 is a circuit diagram illustrating an example of a configuration according to the first embodiment. FIG. 3 illustrates a configuration of the block BLK0 as an example. Configurations of the other blocks BLK1 to BLK3 are equivalent to the configuration of the block BLK0. The block BLK0 includes, for example, four string units SU0 to SU3. In FIG. 3, the configurations of the string units SU2 and SU3 are simplified and illustrated.

Each of the string units SU includes a plurality of NAND strings NS respectively associated with bit lines BL0 to BLm (m is an integer equal to or larger than 1). The NAND string NS includes, for example, memory cell transistors'MT0 to MT7 and select transistors ST1 and ST2.

The memory cell transistor MT includes a control gate and a charge storage layer and stores data in a nonvolatile manner. Each of the select transistors ST1 and ST2 is used to select the string unit SU during various kinds of processing.

In each of NAND strings NS, the memory cell transistors MT0 to MT7 are coupled in series. The select transistor ST1 is coupled between one ends of the memory cell transistors MT0 to MT7 coupled in series and bit lines BL associated with the memory cell transistors MT0 to MT7. A drain of the select transistor ST2 is coupled to the other ends of the memory cell transistors MT0 to MT7 coupled in series. A source line SL is coupled to a source of the select transistor ST2.

In the same block BLK, gates of the select transistors ST1 included in the string units SU0 to SU3 are respective coupled to select gate lines SGD0 to SGD3 in common. Control gates of the memory cell transistors MT0 to MT7 are respectively coupled to word lines WL0 to WL7 in common. Gates of a plurality of select transistors ST2 are coupled to a select gate line SGS in common.

The bit lines BL0 to BLm are shared by a plurality of blocks BLK0 to BLK3. The same bit line BL is coupled to the NAND strings NS corresponding to the same column address. Each of the word lines WL0 to WL7 is provided in each of the blocks BLK0 to BLK3. The source line SL is shared by, for example, the blocks BLK0 to BLK3.

A set of a plurality of memory cell transistors MT coupled to the common word line WL in one string unit SU is referred to as, for example, a cell unit CU and is used as a data write unit. For example, a storage capacity of the cell unit CU including the memory cell transistors MT each storing 1-bit data is defined as "one-page data". That is, the one-page data is a data region of a 1-bit data string having the number of rows corresponding to the number of memory cell transistors MT in the cell unit CU. The one-page data is used as, for example, a data read unit. The cell unit CU can have a storage capacity of two page data or more according to the number of bit data stored by the memory cell transistor MT.

Note that a circuit configuration of the block BLK explained above is only an example and is not limited to this. For example, the number of blocks BLK included in the nonvolatile memory 10 may be designed to be any number. The number of string units SU included in each of the blocks BLK may be designed to any number. The number of each of memory cell transistors MT and select transistors ST1 and ST2 included in each of NAND strings NS may be designed to any number.

In the present embodiment, one memory cell transistor MT can store 3-bit data. That is, the memory cell transistor MT in the present embodiment is a TLC (Triple Level Cell) that stores 3-bit data. The 3-bit data stored by a memory cell transistor of a TLC is referred to as lower bit, middle bit, and upper bit in order from the lowest bit. A set of lower bits stored by the memory cell transistors MT included in the same cell unit CU is referred to as a "lower page", a set of middle bits is referred to as a "middle page", and a set of upper bits is referred to as an "upper page".

Figures 4, 5:
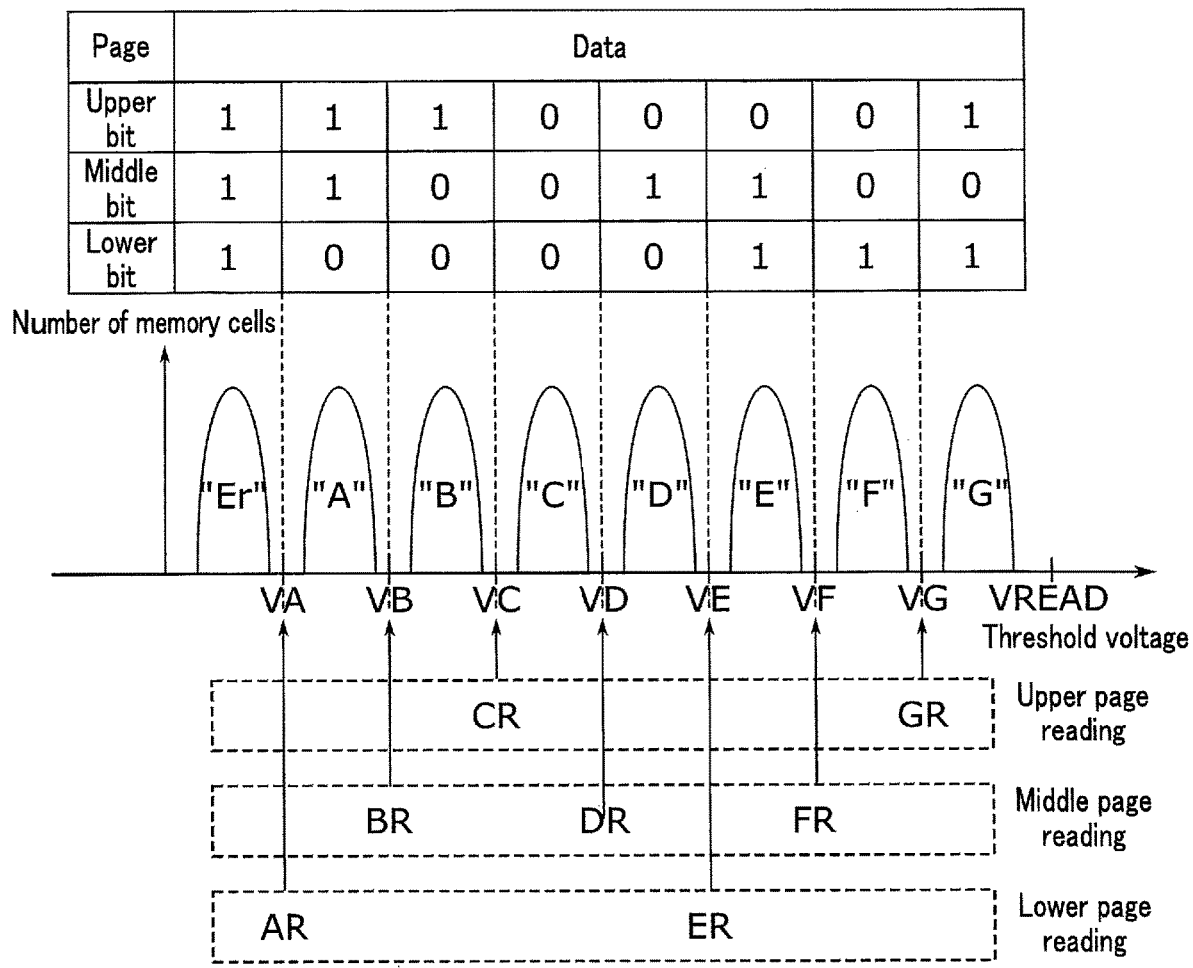
FIG. 4 is a schematic diagram illustrating an example of threshold voltage distributions of a plurality of memory cell transistors according to the first embodiment.
FIG. 5 is a diagram illustrating an example of block management information of a memory system according to the first embodiment.

FIG. 4 is a schematic diagram illustrating an example of threshold voltage distributions of the memory cell transistors MT according to the first embodiment. In a case where the memory cell transistor MT stores 3-bit data, a distribution of a threshold voltage of the memory cell transistor MT is divided into eight. The eight threshold voltage distributions are referred to as "Er" state, "A" state, "B" state, "C" state, "D" state, "E" state, "F" state, and "G" state in order from the threshold voltage distribution with the lowest threshold voltage.

Voltages VA, VB, VC, VD, VE, VF, and VG illustrated in FIG. 4 are respectively used to distinguish two adjacent states in read processing. A voltage VREAD is a voltage applied to a non-selected word line during the read processing. When the voltage VREAD is applied to a gate of the memory cell transistor MT, the memory cell transistor MT is turned on regardless of data to be stored. A relations among these voltage values is VA<VB<VC<VD<VE<VF<VG<VREAD.

The "Er" state among the threshold voltage distributions explained above is equivalent to an erase state of the memory cell transistor MT. A threshold voltage in the "Er" state is less than the voltage VA. A threshold voltage in the "A" state is the voltage VA or more and less than the voltage VB. A threshold voltage in the "B" state is the voltage VB or more and less than the voltage VC. A threshold voltage in the "C" state is the voltage VC or more and less than the voltage VD. A threshold voltage in the "D" state is the voltage VD or more and less than the voltage VE. A threshold voltage in the "E" state is the voltage VE or more and less than the voltage VF. A threshold voltage in the "F" state is the voltage VF or more and less than the voltage VG. The threshold voltage in the "G" state is the voltage VG or more and less than the voltage VREAD.

The eight threshold voltage distributions explained above are formed by writing the 3-bit (three-page) data including the lower bit, the middle bit, and the upper bit. The eight threshold voltage distributions respectively correspond to different 3-bit data. In the present embodiment, data is allocated to "upper bit/middle bit/lower bit" for the memory cell transistors MT included in the states as explained below.

The memory cell transistor MT included in the "Er" state stores "111" data. The memory cell transistor MT included in the "A" state stores "110" data. The memory cell transistor MT included in the "B" state stores "100" data. The memory cell transistor MT included in the "C" state stores "000" data. The memory cell transistor MT included in the "D" state stores "010" data. The memory cell transistor MT included in the "E" state stores "011" data. The memory cell transistor MT included in the "F" state stores "001" data. The memory cell transistor MT included in the "G" state stores "101" data.

In the lower page read, the voltage VA that distinguishes the "Er" state and the "A" state and the voltage VE that distinguishes the "D" state and the "E" state are used as the read voltages.

In the middle page read, the voltage VB that distinguishes the "A" state and the "B" state, the voltage VD that distinguishes the "C" state and the "D" state, and the voltage VF that distinguishes the "E" state and the "F" state are used as the read voltages.

In the upper page read, the voltage VC that distinguishes the "B" state and the "C" state and the voltage VG that distinguishes the "F" state and the "G" state are used as the read voltages.

1.1.6 Block Management Information

Subsequently, a configuration of the block management information 21 is explained. FIG. 5 is a diagram illustrating an example of a configuration of the block management information of the memory system according to the first embodiment. As illustrated in FIG. 5, information concerning reliability of written data is stored in the block management information 21 for each of the blocks BLK. The information concerning the reliability includes, for example, a refresh flag and a time difference flag.

The refresh flag is a flag indicating whether execution of refresh processing for a target block BLK is reserved. The refresh processing is, for example, processing of writing data to be written in the target block BLK in another block BLK. The refresh processing may be, for example, processing for overwriting the target block BLK with a part or all of the data written in the target block BLK. If the refresh flag is "true", the refresh flag indicates that the refresh processing for the target block BLK is reserved. If the refresh flag is "false", the refresh flag indicates that the refresh processing for the target block BLK is not reserved.

The time difference flag is a flag indicating whether, in a case where data is written in the target block BLK separately in a plurality of times of write processing, time from first write processing to last write processing is long enough to impair reliability of data written first. In the following explanation, a time difference from when data is written in the first write processing until when data is written in the last write processing in a certain block BLK is referred to as "write time difference" as well. If the time difference flag is "true", the time difference flag indicates that the write time difference of the target block BLK is long enough to impair reliability of the target block BLK. If the time difference flag is "false", the time difference flag indicates that the write time difference of the target block BLK is not long enough to impair reliability of the target block BLK.

In the example illustrated in FIG. 5, "true" is stored as both of the refresh flag and the time difference flag in the block BLK0. In the block BLK1, "true" and "false" are respectively stored as the refresh flag and the time difference flag. "false" is stored as both of the refresh flag and the time difference flag in the blocks BLK2 and BLK3.

1.1.7 Shift Amount Information

Subsequently, a configuration of the shift amount information 22 is explained. FIG. 6 is a diagram illustrating a configuration of the shift amount information of the memory system according to the first embodiment. As illustrated in FIG. 6, nmax sets of shift amounts ΔVAn to ΔVGn from default values of the read voltages VA to VG are stored in the shift amount information 22. Here, the number nmax is an integer equal to or larger than 1. The number n is an integer equal to or larger than 0.

The shift amount information 22 is used in retry processing. The retry processing is processing for, when failing in error correction for data read by the read processing, executing new read processing for succeeding in error correction for the read data. Details of the retry processing are explained below.

1.2 Operation

Subsequently, an operation in the memory system according to the first embodiment is explained.

1.2.1 Block Management Processing

FIG. 7 is a flowchart illustrating an example of block management processing in the memory system according to the first embodiment.

When the write processing is executed (start), the memory controller 30 determines whether data is written in all regions in a management target block BLK (S10).

When data has been written in all the regions in the management target block BLK (S10; yes), the memory controller 30 causes the nonvolatile memory 10 to execute read processing for a region in which data is written first in the management target block BLK (S11). Accordingly, the memory controller 30 receives the data written first in the management target block BLK from the nonvolatile memory 10.

The region where the data is written first may be either a physical region or a data region. When being defined as the physical region, the region in which the data is written first may be, for example, one cell unit CU associated with a set of one word line WL and one string unit SU. When being defined as the data region, the region where the data is written first may be, for example, a data region for one or a plurality of pages in one cell unit CU (that is, one or a plurality of pages in which the data is written first in the management target block BLK).

The memory controller 30 calculates the number of fail bits based on the data received from the nonvolatile memory 10 in the processing in S11 (S12). Specifically, the ECC circuit 34 performs error detection processing concerning the data received from the nonvolatile memory 10 in the processing in S11. Accordingly, when the write processing in all the regions in the management target block BLK is completed, the memory controller 30 can grasp in which degree of an error has occurred in the read data from the region where the data is written first.

The memory controller 30 determines whether the number of fail bits calculated in the processing in S12 is equal to or larger than a threshold (S13).

When the number of fail bits is equal to or larger than the threshold, (S13; yes), the memory controller 30 accesses the block management information 21 of the volatile memory 20 and sets the time difference flag of the management target block BLK to "true" (S14).

The memory controller 30 accesses the block management information 21 of the volatile memory 20 and sets the refresh flag of the management target block BLK to "true" (S15).

When a region where data is not written is present in the management target block BLK (S10; no), when the number of fail bits is smaller than the threshold (S13; no), or when the processing in S14 and S15 ends, the block management processing ends (end).

Note that, after the block management processing, the memory controller 30 accesses the block management information 21, for example, at predetermined timing and determines presence or absence of the block BLK in which the refresh flag is set to "true". When the block BLK in which the refresh flag is set to "true" is present, the memory controller 30 executes the refresh processing for the block BLK in which the refresh flag is set to "true". After the refresh processing is executed, the memory controller 30 sets the refresh flag corresponding to the block BLK for which the refresh processing is executed to "false". Such execution determination processing for the refresh processing may be executed synchronously with the block management processing or may be executed asynchronously with the block management processing.

1.2.2 Host Read Processing

FIG. 8 is a flowchart illustrating an example of a series of processing including host read processing in the memory system according to the first embodiment. The host read processing is read processing executed in response to a request (a read request) from the host device 2.

When receiving a read request from the host device 2 (start), the memory controller 30 causes the nonvolatile memory 10 to execute the host read processing for a read target region (S20). Accordingly, the memory controller 30 receives data written in the read target region from the nonvolatile memory 10.

The ECC circuit 34 of the memory controller 30 executes error detection processing and error correction processing concerning the data received from the nonvolatile memory 10 in the host read processing in S20. The ECC circuit 34 determines whether correction of an error included in the data is successful in the error detection processing and the error correction processing (S21).

When failing in the correction of the error (S21; no), the memory controller 30 accesses the block management information 21 of the volatile memory 20 and determines whether the time difference flag of the block BLK including the read target region is "false" (S22).

When the time difference flag of the block BLK including the read target region is "false" (S22; yes), the memory controller 30 executes first retry processing for the block BLK including the read target region (S23).

When the time difference flag of the block BLK including the read target region is "true" (S22; no), the memory controller 30 executes second retry processing for the block BLK including the read target region (S24).

In the first retry processing and the second retry processing, for example, new read processing using a read voltage different from the read voltage in the host read processing in S20 is executed.

When the memory controller 30 succeeds in the correction of the error (S21; yes), after the first retry processing in S23 or after the second retry processing in S24, a series of processing including the host read processing ends (end).

1.2.3 First Retry Processing

Figure 9:
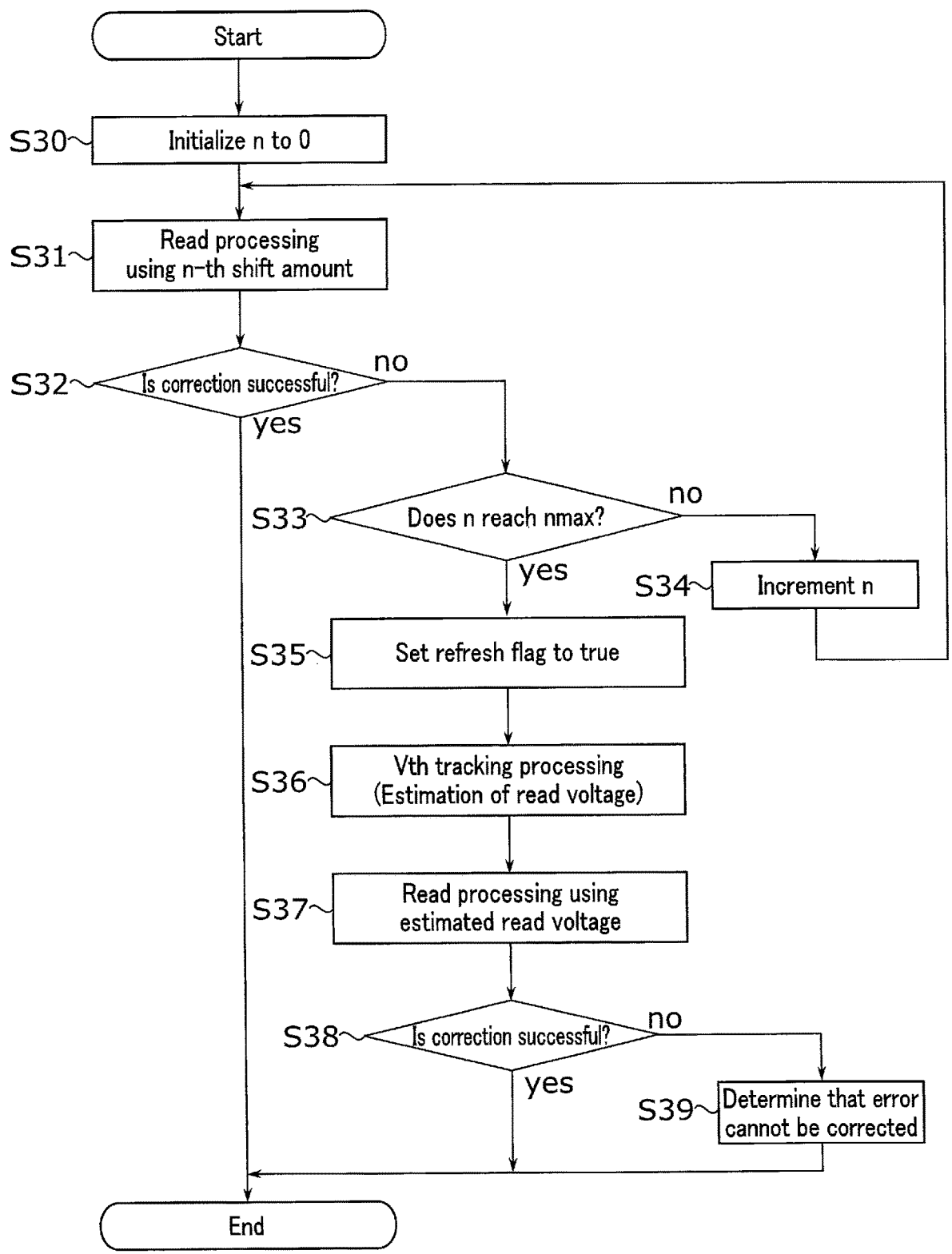
FIG. 9 is a flowchart illustrating an example of first retry processing in the memory system according to the first embodiment.

FIG. 9 is a flowchart illustrating an example of the first retry processing in the memory system according to the first embodiment. The processing in S30 to S39 illustrated in FIG. 9 corresponds to the processing in S23 in FIG. 8.

When failing in the correction of the error in the host read processing and the time difference flag of the block BLK including the read target region is "false" (start), the memory controller 30 initializes the number n to 0 (S30).

The memory controller 30 causes the nonvolatile memory 10 to execute the read processing for the read target region using an n-th shift amount (S31).

The ECC circuit 34 of the memory controller 30 executes the error detection processing and the error correction processing concerning the data received from the nonvolatile memory 10 in the read processing in S31. The ECC circuit 34 determines whether the correction of the error included in the data is successful in the error detection processing and the error correction processing (S32).

When failing in the correction of the error (S32; no), the memory controller 30 determines whether the number n has reached the number nmax (S33).

When the number n has not reached the number nmax (S33; no), the memory controller 30 increments the number n (S34).

After the processing in S34, the memory controller 30 causes the nonvolatile memory 10 to execute the read processing for the read target region using the n-th shift amount incremented in the processing in S34 (S31). In this way, the processing in S31 to S34 are repeated until the memory controller 30 succeeds in the correction of the error in the processing in S32 or until the number n reaches the number nmax.

When the number n has reached the number nmax (S33; yes), the memory controller 30 accesses the block management information 21 of the volatile memory 20 and sets the refresh flag of the block BLK including the read target region to "true" (S35).

After the processing in S35, the memory controller 30 executes Vth tracking processing (S36). The Vth tracking processing is processing for estimating a threshold voltage distribution in a read target region by executing a plurality of times of read processing using read voltages different from one another for the read target region and estimating a read voltage based on the estimated threshold voltage distribution.

The memory controller 30 causes the nonvolatile memory 10 to execute read processing using the read voltage estimated by the Vth tracking processing in S36 for the read target region (S37).

The ECC circuit 34 of the memory controller 30 executes error detection processing and error correction processing concerning the data received from the nonvolatile memory 10 in the read processing in S37. The ECC circuit 34 determines whether correction of an error included in the data is successful in the error detection processing and the error correction processing (S38).

When failing in the correction of the error (S38; no), the memory controller 30 determines that the error included in the data read from the read target region cannot be corrected (S39).

When the memory controller 30 succeeds in the correction of the error based on the read processing using the shift amount in the shift amount information 22 or the read voltage estimated by the Vth tracking processing (S32; yes or S38; yes) or after the processing of S39, the first retry processing ends (end).

1.2.4 Second Retry Processing

Figures 10, 11:
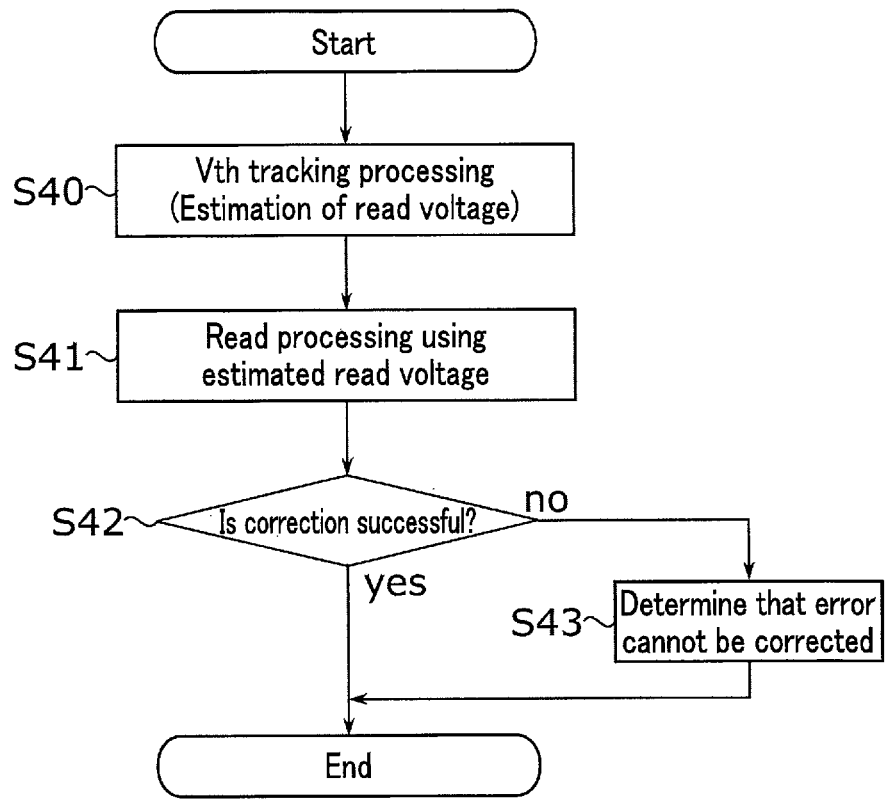
FIG. 10 is a flowchart illustrating an example of second retry processing in the memory system according to the first embodiment.
FIG. 11 is a diagram illustrating an example of block management information of a memory system according to a second embodiment.

FIG. 10 is a flowchart illustrating an example of second retry processing in the memory system according to the first embodiment. The processing in S40 to S43 illustrated in FIG. 10 corresponds to the processing in S24 in FIG. 8.

When failing in the correction of the error in the host read processing and the time difference flag of the block BLK including the read target region is "true" (start), the memory controller 30 executes the Vth tracking processing (S40).

The memory controller 30 causes the nonvolatile memory 10 to execute read processing using a read voltage estimated by the Vth tracking processing in S40 for a read target region (S41).

The ECC circuit 34 of the memory controller 30 executes error detection processing and error correction processing concerning data received from the nonvolatile memory 10 by the read processing in S41. The ECC circuit 34 determines whether the correction of the error included in the data is successful in the error detection processing and the error correction processing (S42).

When failing in the correction of the error (S42; no), the memory controller 30 determines that the error included in the data read from the read target region cannot be corrected (S43).

When the memory controller 30 succeeds in the correction of the error (S42; yes) or after the processing in S43, the second retry processing ends (end).

In this way, in the second retry processing, the read processing using the shift amount information 22 in the first retry processing is omitted. Accordingly, When the time difference flag is "true", the memory controller 30 can further simplify the retry processing than when the time difference flag is "false".

Note that, as in the case of the block management processing, the memory controller 30 can execute execution determination processing for the refresh flag after the host read processing. Details of the execution determination processing for the refresh flag are the same as those in the block management processing. Therefore, explanation of the details is omitted. Note that the execution determination processing of the refresh processing may be executed synchronously with the host read processing or may be executed asynchronously with the host read processing.

1.3 Effects According to the First Embodiment

The number of fail bits tends to increase according to an elapsed time after data is written. Therefore, when a write time difference is large and all the regions in the block BLK are written, data read from a region where data is written first is likely to undesirably include a significantly large number of fail bits with respect to data read from a region where data is written last.

According to the first embodiment, the memory controller 30 reads data from a region where data is written first in the block BLK according to data being written in all the regions in the block BLK. If the number of fail bits included in the read data is equal to or larger than the threshold, the memory controller 30 determines that a write time difference that occurs between time when data is written first and time when data is written last in the block BLK is significantly large. Accordingly, the memory controller 30 can detect the block BLK having a large write time difference.

When the write time difference is significantly large, the memory controller 30 sets the refresh flag corresponding to the block BLK to "true". Accordingly, the refresh processing is executed as appropriate. Accordingly, the write time difference of the block BLK can be eliminated. Therefore, deterioration in reliability of write data can be suppressed.

When the write time difference is significantly large, the memory controller 30 further sets the time difference flag corresponding to the block BLK to "true". Accordingly, information concerning whether a large write time difference occurs between the first and last regions in the writing order in the block BLK can be managed by 1-bit information for each of the blocks BLK.

When failing in the correction of the fail bit in the host read processing, the memory controller 30 executes different kinds of retry processing according to whether or not "true" is set in the time difference flag. Accordingly, when the write time difference is significantly large and it is assumed that the error correction processing is unsuccessful in the retry processing based on the shift amount information 22, it is possible to quickly shift to the Vth tracking processing without executing the read processing based on the shift amount information 22. Accordingly, time required for the retry processing can be reduced.

2. Second Embodiment

Subsequently, a memory system according to a second embodiment is explained. The second embodiment is different from the first embodiment in that a shift amount of a read voltage is managed for each of blocks BLK. In the following explanation, explanation is omitted about configurations and operations equivalent to those in the first embodiment. Configurations and operations different from those in the first embodiment are mainly described.

2.1 Block Management Information

FIG. 11 is a diagram illustrating an example of a configuration of block management information of the memory system according to the second embodiment. FIG. 11 corresponds to FIG. 5 in the first embodiment. As illustrated in FIG. 11, in addition to the refresh flag and the time difference flag, an anchor ID, a head ID, and a tail ID are stored in block management information 21A for each of the blocks BLK.

The anchor ID, the head ID, and the tail ID are compressed values of a set of shift amounts of each of read voltages VA to VG. That is, one ID corresponds to one set of shift amounts=($\Delta$VA, $\Delta$VB, $\Delta$VC, $\Delta$VD, $\Delta$VE, $\Delta$VF, $\Delta$VG). The one set of shift amounts is calculated by shift amount calculation processing. The one set of shift amounts is compressed into one ID by compression processing. Details of the shift amount calculation processing and the compression processing are explained below.

The anchor ID is a compressed value of a shift amount calculated by the shift amount calculation processing for an anchor region in a management target block BLK. The anchor region is a region representing the management target block BLK. When data is read from a read target region different from the anchor region, for example, a memory controller 30 expands the anchor ID into one set of shift amounts and, thereafter, corrects the expanded one set of shift amounts according to a positional relation between the read target region and the anchor region. In this way, the memory controller 30 has a function of calculating, based on the anchor ID, a shift amount of a read voltage in any region in the management target block BLK corresponding to the anchor ID. Note that the anchor region may correspond to one cell unit. The anchor region may correspond to one or a plurality of pages in the cell unit CU.

The head ID is a compressed value of a shift amount calculated by the shift amount calculation processing for a region where data is written first in the management target block BLK (hereinafter referred to as "head region" as well). The memory controller 30 may have a function of calculating, based on a head ID, a shift amount of a read voltage in any region in the management target block BLK corresponding to the head ID. Note that the head region may correspond to one cell unit. The head region may correspond to one or a plurality of pages in the cell unit CU.

The tail ID is a compressed value of a shift amount calculated by the shift amount calculation processing for a region where data is written last in the management target block BLK (hereinafter referred to as "tail region" as well). The memory controller 30 may have a function of calculating, based on a tail ID, a shift amount of a read voltage in any region in the management target block BLK corresponding to the tail ID. Note that the tail region may correspond to one cell unit. The tail region may correspond to one or a plurality of pages in the cell unit CU.

In the example illustrated in FIG. 11, 9 is stored as the anchor ID, 3 is stored as the head ID, and 8 is stored as the tail ID in a block BLK0. In blocks BLK1, BLK2, and BLK3, 3, 4, and 5 are respectively stored as the anchor ID. The head ID and the tail ID are not stored in blocks BLK1, BLK2, and BLK3.

2.2 Block Management Processing

Figure 12:
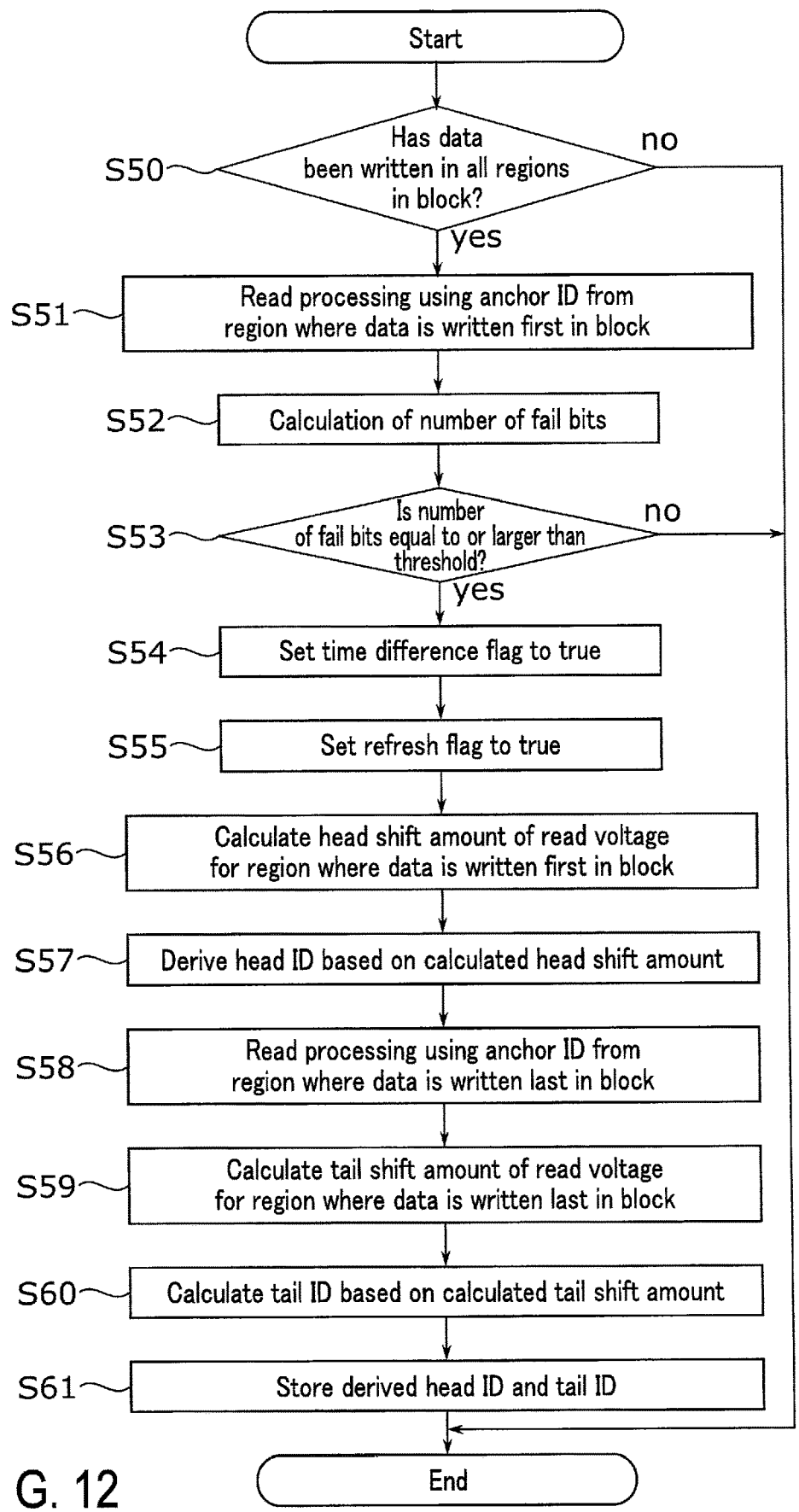
FIG. 12 is a flowchart illustrating an example of block management processing in the memory system according to the second embodiment.

FIG. 12 is a flowchart illustrating an example of block management processing in the memory system according to the second embodiment. FIG. 12 corresponds to FIG. 7 in the first embodiment. In the example illustrated in FIG. 12, it is assumed that an anchor ID corresponding to a management target block BLK is stored in advance in the block management information 21A.

When write processing is executed (start), the memory controller 30 determines whether data is written in all regions in the management target block BLK (S50).

When data has been written in all the regions in the management target block BLK (S50; yes), the memory controller 30 causes a nonvolatile memory 10 to execute, based on the anchor ID, read processing for a head region in the management target block BLK (S51). Accordingly, the memory controller 30 receives the data written first in the management target block BLK from the nonvolatile memory 10.

The memory controller 30 calculates the number of fail bits based on the data received from the nonvolatile memory 10 in the processing in S51 (S52). Specifically, the ECC circuit 34 executes error detection processing concerning the data received from the nonvolatile memory 10 in the processing in S51. Accordingly, when the write processing in all the regions in the management target block BLK is completed, the memory controller 30 can grasp in which degree of an error has occurred in the read data from the head region.

The memory controller 30 determines whether the number of fail bits calculated in the processing in S52 is equal to or larger than a threshold (S53).

When the number of fail bits is equal to or larger than the threshold (S53; yes), the memory controller 30 accesses block management information 21A of the volatile memory 20 and sets a time difference flag of the management target block BLK to "true" (S54).

The memory controller 30 accesses the block management information 21A of the volatile memory 20 and sets a refresh flag of the management target block BLK to "true" (S55).

The memory controller 30 executes shift amount calculation processing based on a result of the read processing in S51. Accordingly, the memory controller 30 calculates a shift amount (a head shift amount) of a read voltage for a head region in the management target block BLK (S56).

The memory controller 30 executes compression processing for the head shift amount calculated by the shift amount calculation processing in S56. Accordingly, the memory controller 30 derives a head ID based on the head shift amount (S57).

Further, the memory controller 30 causes the nonvolatile memory 10 to execute read processing for the tail region in the management target block BLK based on the anchor ID (S58). Accordingly, the memory controller 30 receives, from the nonvolatile memory 10, data written last in the management target block BLK.

The memory controller 30 executes shift amount calculation processing based on a result of the read processing in S58. Accordingly, the memory controller 30 calculates a shift amount (a tail shift amount) of a read voltage for the tail region in the management target block BLK (S59).

The memory controller 30 executes compression processing for the tail shift amount calculated in the shift amount calculation processing in S59. Accordingly, the memory controller 30 derives a tail ID based on the tail shift amount (S60).

The memory controller 30 stores the head ID derived by the compression processing in S57 and the tail. ID derived by the compression processing in S60 in the block management information 21A of the volatile memory 20 in association with the management target block BLK (S61).

After the processing in S61, the block management processing ends (end).

2.3 Shift Amount Calculation Processing

Subsequently, details of the shift amount calculation processing in S56 and S59 are explained. In the following explanation, the shift amount calculation processing based on data read using a default value of a read voltage is explained.

After the read processing in S51 and S58, the ECC circuit 34 executes error detection processing for the read data. Accordingly, the memory controller 30 can grasp a data string before correction and a data string after correction for each of column addresses of the read data. Accordingly, the memory controller 30 can grasp, for each of the column addresses of the read data, a (true) state at the time when the data is written and a (possibly including an error) state at the time when the data is read. Specifically, for example, the memory controller 30 can grasp the number of memory cells E12 in which data written as an "A" state is erroneously read as an "Er" state. The memory controller 30 can grasp the number of memory cells E21 in which data written as the "Er" state is erroneously read as the "A" state.

Figure 13:
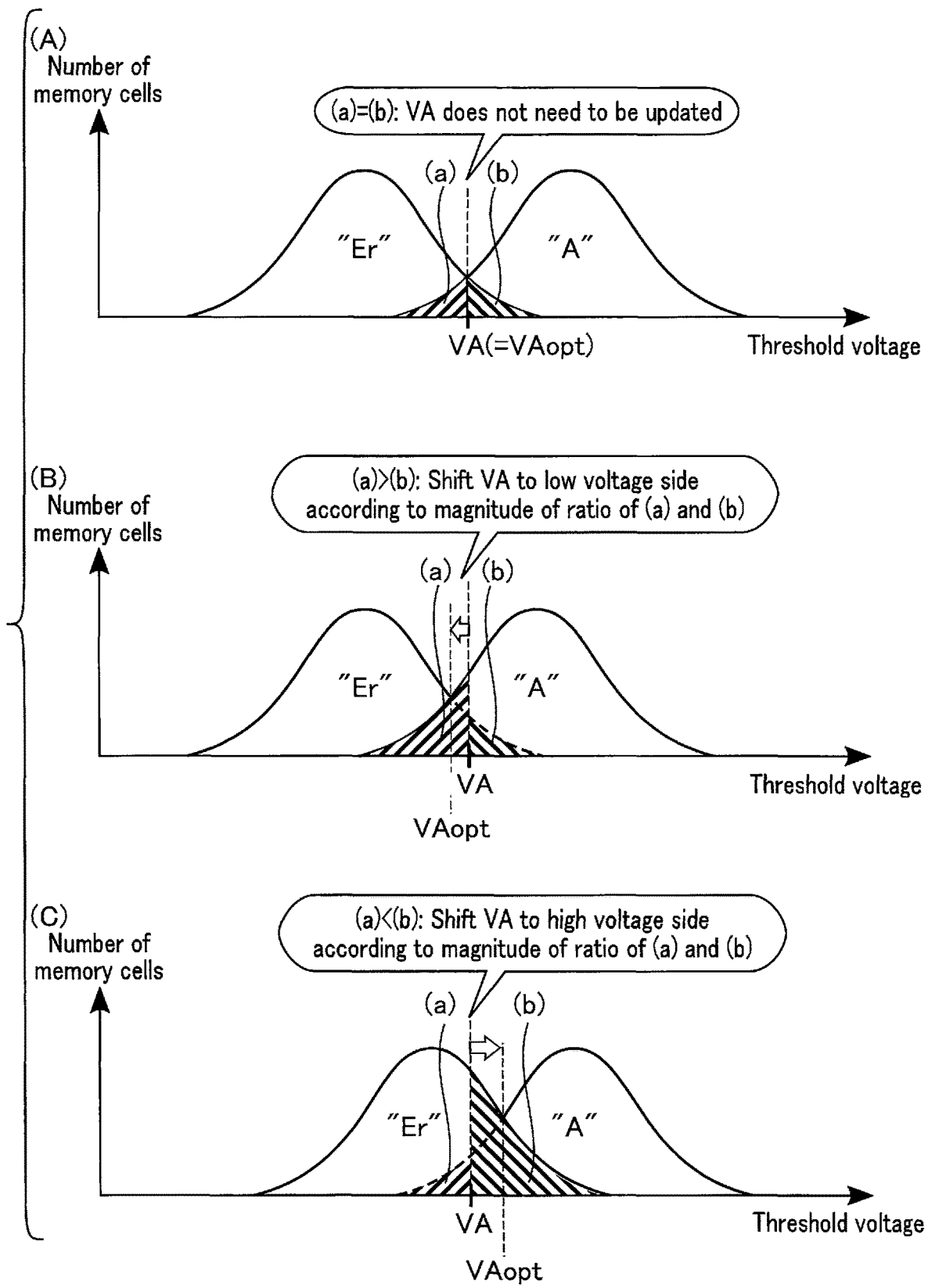
FIG. 13 is a diagram illustrating an example of shift amount calculation processing in the memory system according to the second embodiment.

FIG. 13 is a diagram illustrating an example of the shift amount calculation processing in the memory system according to the second embodiment. In the example illustrated in (A) to (C) of FIG. 13(A), a shift amount of the read voltage VA is calculated. In (A) to (C) of FIG. 13, the number of memory cells E12 in which data written as the "A" state is erroneously read as the "Er" state corresponds to an area of a region (a) in (A) to (C) of FIG. 13. The number of memory cells E21 in which data written as the "Er" state is erroneously read as the "A" state corresponds to an area of the region (b) in (A) to (C) of FIG. 13.

In (A) of FIG. 13, the read voltage VA is equal to a threshold voltage VAopt at an intersection position of two threshold voltage distributions corresponding to the "Er" state and the "A" state. In the case of (A) of FIG. 13, the area of the region (a) and the area of the region (b) are equal. In this case, the number of fail bits E (=E12+E21) occurring between the "Er" state and the "A" state is expected to be minimum. Accordingly, the memory controller 30 determines that the read voltage VA does not need to be updated. That is, the memory controller 30 calculates a shift amount $\Delta VA$ of "0" ($\Delta VA=0$).

In (B) of FIG. 13, the read voltage VA is located on a higher voltage side than the threshold voltage VAopt at the intersection position of the two threshold voltage distributions corresponding to the "Er" state and the "A" state. In the case of (B) of FIG. 13, the area of the region (a) is larger than the area of the region (b). In this case, the number of fail bits E is undesirably larger than the number of fail bits E in the case of (A) of FIG. 13. Accordingly, the memory controller 30 shifts the read voltage VA to a low voltage side to be closer to the voltage VAopt. That is, the memory controller 30 calculates a negative shift amount $\Delta VA$ ($\Delta VA<0$).

In (C) of FIG. 13, the read voltage VA is located on a lower voltage side than the threshold voltage VAopt at the intersection position of the two threshold voltage distributions corresponding to the "Er" state and the "A" state. In the case of (C) of FIG. 13, the area of the region (a) is smaller than the area of the region (b). In this case, the number of fail bits E is undesirably larger than the number of fail bits E in the case of (A) of FIG. 13. Accordingly, the memory controller 30 shifts the read voltage VA to a high voltage side to be closer to the voltage VAopt. That is, the memory controller 30 calculates a positive shift amount $\Delta VA$ ($\Delta VA>0$).

Note that the absolute value of the difference between the area of the region (a) and the area of the region (b) is expected to increase as the read voltage VA further separates from the threshold voltage VAopt. Accordingly, the memory controller 30 determines the shift amount $\Delta VA$ of the read voltage VA according to magnitude of a ratio of the area of the region (a) and the area of the region (b). Accordingly, an appropriate shift amount can be determined according to a degree of overlap of the threshold voltage distributions. The shift amount $\Delta VA$ can be calculated to be closer to the threshold voltage VAopt.

Note that, although not illustrated, shift amounts $\Delta VB$ to $\Delta VG$ are calculated for the other read voltages VB to VG in the same manner as in the case of the read voltage VA.

By operating as explained above, in the shift amount calculation processing in S56, a set of shift amounts based on data read from the head region is calculated as the head shift amount. In the shift amount calculation processing in S59, a set of shift amounts based on data read from the tail region is calculated as the tail shift amount.

Note that, in shift amount calculation processing based on data read using a value (VA0+$\Delta$VApre) obtained by adding a shift amount $\Delta$VApre to the default value VA0 of the read voltage VA, the shift amount $\Delta$VApre is updated to the following shift amount $\Delta$VApost. That is, as illustrated in (A) of FIG. 13, when the area of the region (a) and the area of the region (b) are equal, it is unnecessary to update the shift amount $\Delta VA$. Accordingly, the shift amount $\Delta$VApost=the shift amount $\Delta$VApre. As illustrated in (B) of FIG. 13, when the area of the region (a) is larger than the area of the region (b), the shift amount $\Delta$VApost is updated to a value lower than the shift amount $\Delta$VApre. As illustrated in (C) of FIG. 13, when the area of the region (a) is smaller than the area of the region (b), the shift amount $\Delta$VApost is updated to a value higher than the shift amount $\Delta$VApre.

2.4 Compression Processing

Subsequently, details of the compression processing in S57 and S60 are explained.

A set of shift amounts is characterized by k-dimensional feature values (k is an integer equal to or larger than 1). The compression processing is processing for associating one set of shift amounts with a compression value based on a k-dimensional feature value that characterizes the one set of shift amounts.

Figure 14:
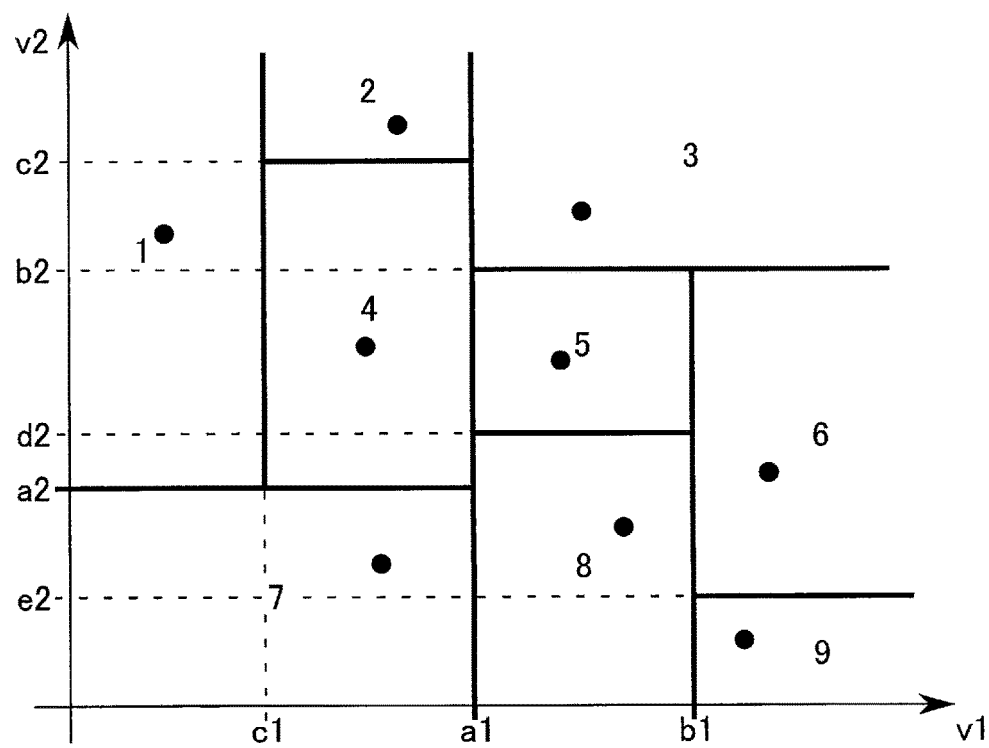
FIG. 14 is a diagram illustrating an example of a plurality of compression values classified according to regions in compression processing in the memory system according to the second embodiment.

FIG. 14 is a diagram illustrating an example of a plurality of compression values classified by regions in the compression processing in the memory system according to the second embodiment. In FIG. 14, as an example, k is 2. That is, one set of shift amounts is mapped on a two-dimensional space by a v1 axis and a v2 axis intersecting each other. A compression value is allocated to the one set of shift amounts according to a position mapped on the two-dimensional space.

In the example illustrated in FIG. 14, a compression value 1 is allocated to one set of shift amounts characterized by a feature value v1 smaller than c1 and a feature value v2 equal to or larger than a2. A compressed value 2 is allocated to one set of shift amounts characterized by the feature value v1 equal to or larger than c1 and smaller than a1 and the feature value v2 equal to or larger than c2. A compression value 3 is allocated to one set of shift amounts characterized by the feature value v1 equal to or larger than a1 and the feature value v2 equal to or larger than b2. A compression value 4 is allocated to one set of shift amounts characterized by the feature value v1 equal to or larger than c1 and smaller than a1 and the feature value v2 equal to or larger than a2 and smaller than c2. A compression value 5 is allocated to one set of shift amounts characterized by the feature value v1 equal to or larger than a1 and smaller than b1 and the feature value v2 equal to or larger than d2 and smaller than b2. A compression value 6 is allocated to one set of shift amounts characterized by the feature value v1 equal to or larger than b1 and the feature value v2 of equal to or larger than e2 and smaller than b2. A compression value 7 is allocated to one set of shift amounts characterized by the feature value v1 smaller than a1 and the feature value v2 smaller than a2. A compression value 8 is allocated to one set of shift amounts characterized by the feature value v1 equal to or larger than a1 and smaller than b1 and the feature value v2 of smaller than d2. A compression value 9 is allocated to one set of shift amounts characterized by the feature value v1 equal to or larger than b1 and the feature value v2 of smaller than e2.

Here, the numbers a1, b1, and c1 satisfy a magnitude relation of c1<a1<b1. The numbers a2, b2, c2, d2, and e2 satisfy a magnitude relation of e2<a2<d2<b2<c2.

Figure 15:
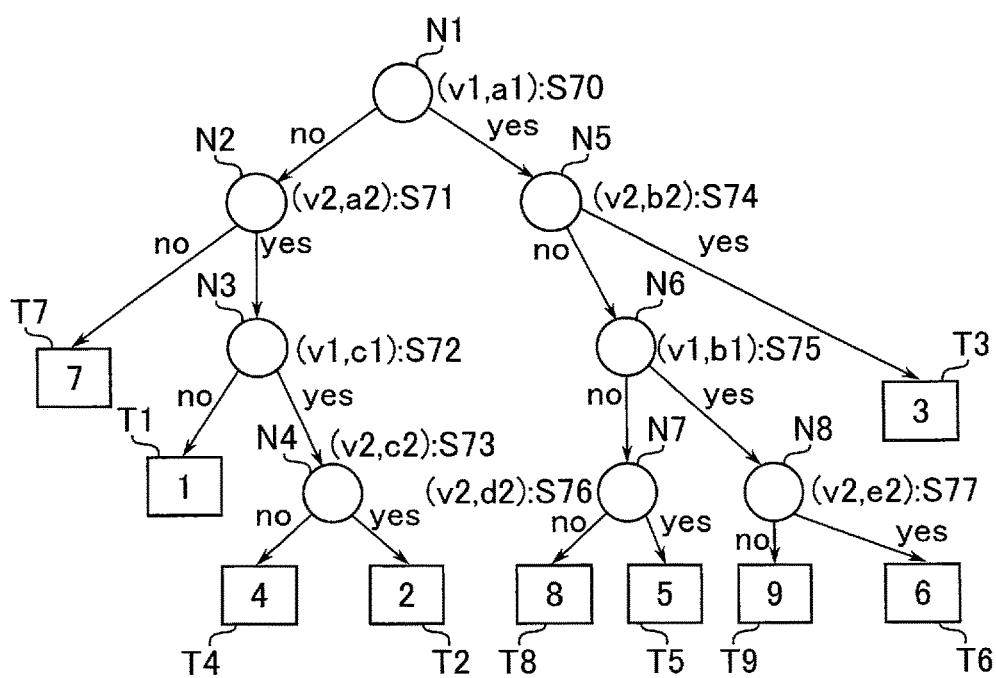
FIG. 15 is a diagram illustrating an example of a plurality of compression values classified according to a binary tree in the compression processing in the memory system according to the second embodiment.

The allocation of the compression value as described above is classified using, for example, a binary tree. FIG. 15 is a diagram illustrating an example of a plurality of compression values classified by the binary tree in the compression processing in the memory system according to the second embodiment. The binary tree illustrated in FIG. 15 corresponds to the allocation of the compression value illustrated in FIG. 14.

As illustrated in FIG. 15, the binary tree includes, for example, eight nodes N1 to N8 and nine terminal nodes T1 to T9. The nodes N1 to N8 respectively correspond to different kinds of determination processing S70 to S77 for feature values. In FIG. 15, determination processing for determining "whether a feature value X is equal to or larger than Y" is symbolized as (X, Y).

That is, in the node N1, the memory controller 30 determines whether the feature value v1 is equal to or larger than a1 (S70).

When the feature value v1 is smaller than a1 (S70; no), the memory controller 30 determines whether the feature value v2 is equal to or larger than a2 (S71).

When the feature value v2 is smaller than a2 (S71; no), the memory controller 30 determines that a compression value of one set of shift amounts is 7.

When the feature value v2 is equal to or larger than a2 (S71; yes), the memory controller 30 determines whether the feature value v1 is equal to or larger than c1 (S72).

When the feature value v1 is smaller than c1 (S72; no), the memory controller 30 determines that the compression value of one set of shift amounts is 1.

When the feature value v1 is equal to or larger than c1 (S72; yes), the memory controller 30 determines whether the feature value v2 is equal to or larger than c2 (S73).

When the feature value v2 is smaller than c2 (S73; no), the memory controller 30 determines that the compression value of one set of shift amounts is 4.

When the feature value v2 is equal to or larger than c2 (S73; yes), the memory controller 30 determines that the compression value of one set of shift amounts is 2.

When the feature value v1 is equal to or larger than a1 (S70; yes), the memory controller 30 determines whether the feature value v2 is equal to or larger than b2 (S74).

When the feature value v2 is equal to or larger than b2 (S74; yes), the memory controller 30 determines that the compression value of one set of shift amounts is 3.

When the feature value v2 is smaller than b2 (S74; no), the memory controller 30 determines whether the feature value v1 is equal to or larger than b1 (S75).

When the feature value v1 is smaller than b1 (S75; no), the memory controller 30 determines whether the feature value v2 is equal to or larger than d2 (S76).

When the feature value v2 is smaller than d2 (S76; no), the memory controller 30 determines that the compression value of one set of shift amounts is 8.

When the feature value v2 is equal to or larger than d2 (S76; yes), the memory controller 30 determines that the compression value of one set of shift amounts is 5.

When the feature value v1 is equal to or larger than b1 (S75; yes), the memory controller 30 determines whether the feature value v2 is equal to or larger than e2 (S77).

When the feature value v2 is smaller than e2 (S77; no), the memory controller 30 determines that the compression value of one set of shift amounts is 9.

When the feature value v2 is equal to or larger than e2 (S77; yes), the memory controller 30 determines that the compression value of one set of shift amounts is 6.

Accordingly, any set of shift amounts can be assigned to any one of the compression values 1 to 9.

2.3 Host Read Processing

Figure 16:
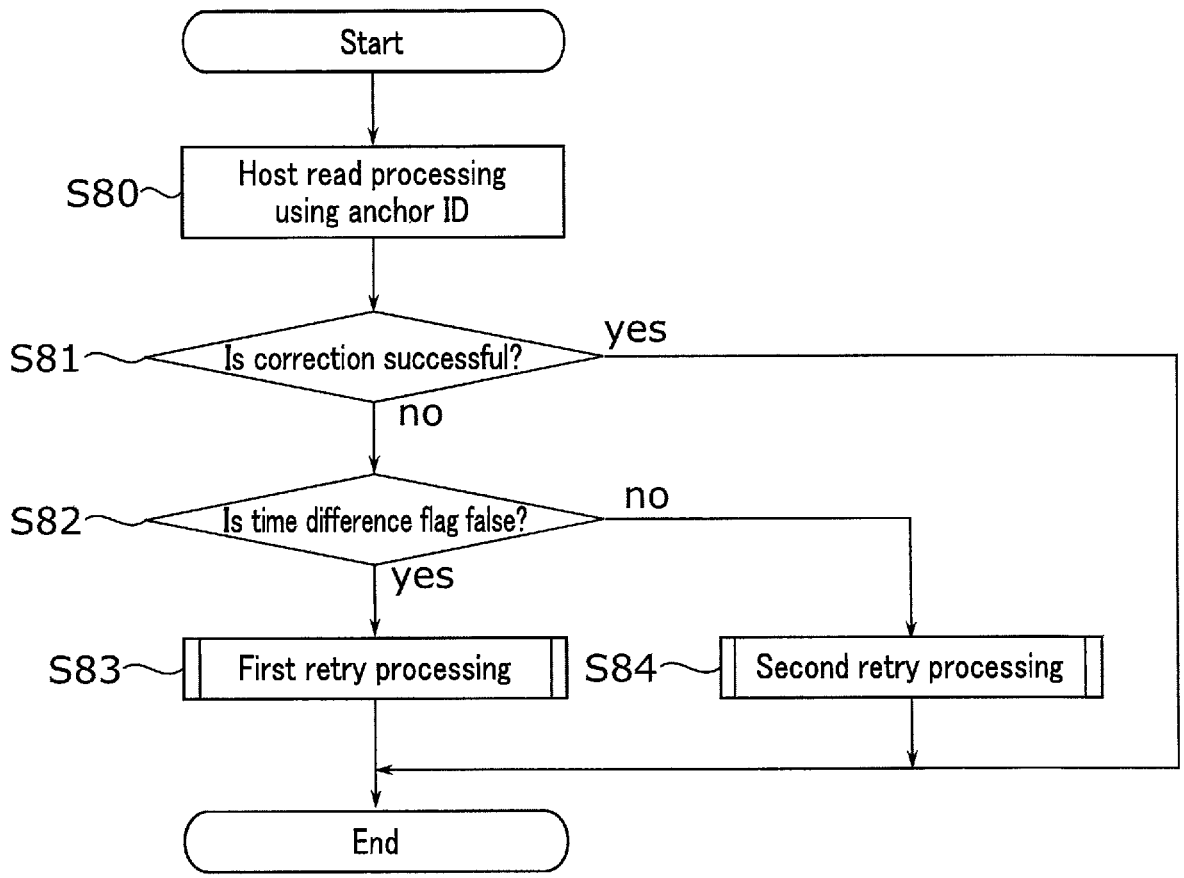
FIG. 16 is a flowchart illustrating an example of a series of processing including host read processing in the memory system according to the second embodiment.

FIG. 16 is a flowchart illustrating an example of a series of processing including host read processing in the memory system according to the second embodiment. FIG. 16 corresponds to FIG. 8 in the first embodiment. In the example illustrated in FIG. 16, it is assumed that the anchor ID corresponding to the readout target block BLK is stored in advance in the block management information 21A.

When a read request is received from the host device 2 (start), the memory controller 30 causes the nonvolatile memory 10 to execute, based on the anchor ID, host read processing for a read target region (S80). Accordingly, the memory controller 30 receives data written in the read target region from the nonvolatile memory 10.

The ECC circuit 34 of the memory controller 30 executes error detection processing and error correction processing concerning the data received from the nonvolatile memory 10 in the host read processing in S80. The ECC circuit 34 determines whether correction of an error included in the data is successful in the error detection processing and the error correction processing (S81).

When failing in the correction of the error (S81; no), the memory controller 30 accesses the block management information 21A of the volatile memory 20 and determines whether the time difference flag of the block BLK including the read target region is "false" (S82).

When the time difference flag of the block BLK including the read target region is "false" (S82; yes), the memory controller 30 executes first retry processing for the block BLK including the read target region (S83). The first retry processing in S83 is equivalent to the first retry processing in S23 in FIG. 8.

When the time difference flag of the block BLK including the read target region is "true" (S82; no), the memory controller 30 executes second retry processing for the block BLK including the read target region (S84). The second retry processing in S84 is different from the second retry processing in S24 in FIG. 8.

When the memory controller 30 succeeds in the correction of the error (S81; yes), after the first retry processing in S83 or after the second retry processing in S84, a series of processing including the host read processing ends (end).

2.4 Second Retry Processing

Subsequently, second retry processing in the memory system according to the second embodiment is explained.

2.4.1 Flowchart

Figure 17:
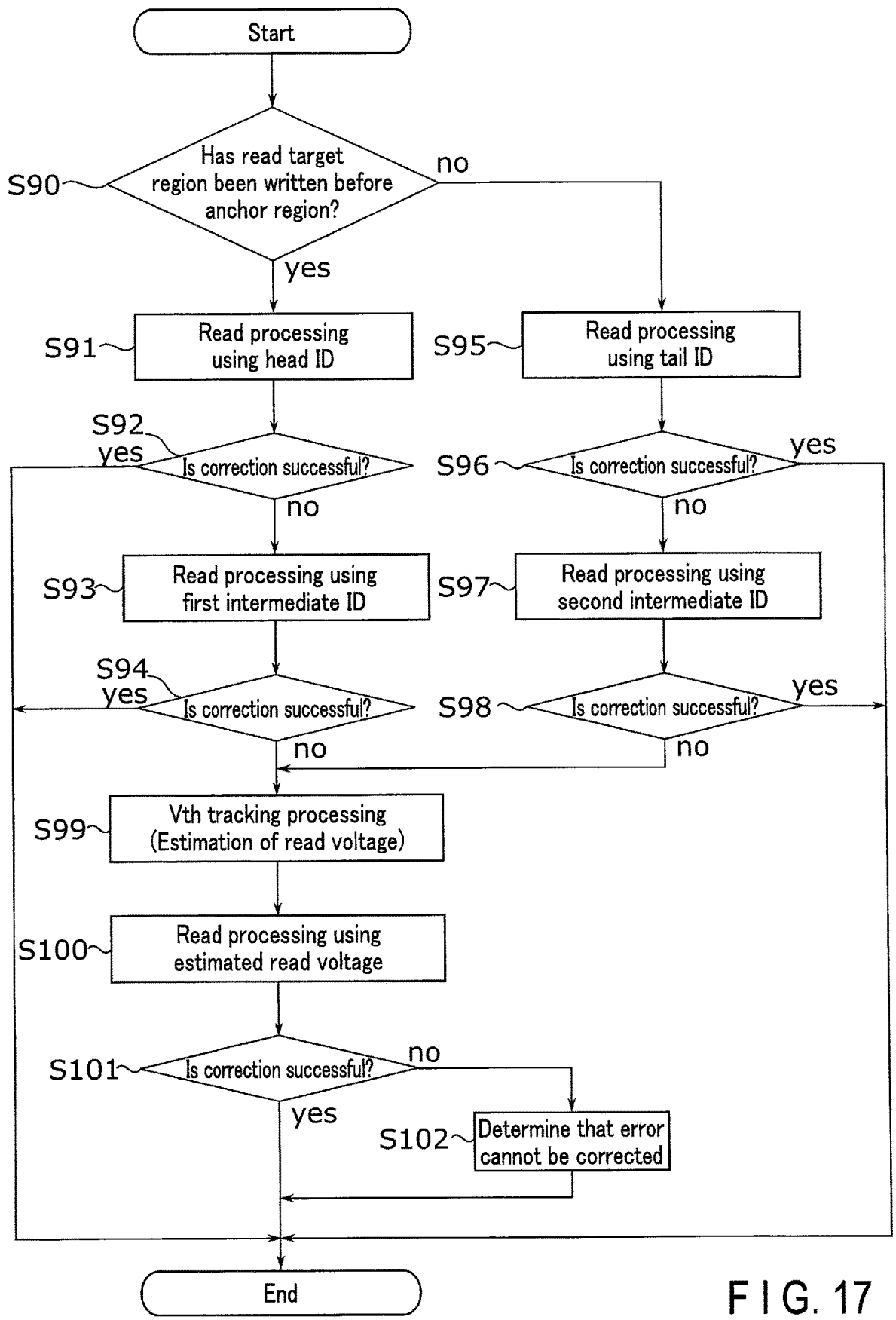
FIG. 17 is a flowchart illustrating an example of second retry processing in the memory system according to the second embodiment.

FIG. 17 is a flowchart illustrating an example of the second retry processing in the memory system according to the second embodiment. Processing in S90 to S102 illustrated in FIG. 17 corresponds to the processing in S84 in FIG. 16. In the example illustrated in FIG. 17, it is assumed that a head ID and a tail ID corresponding to the read target block BLK are stored in advance in the block management information 21A.

When failing in the correction of the error in the host read processing and the time difference flag of the block BLK including the read target region is "true" (start), the memory controller 30 determines whether the read target region has been written before the anchor region (S90).

When the read target region has been written before the anchor region (S90; yes), the memory controller 30 causes the nonvolatile memory 10 to execute, based on the head ID, the read processing for the read target region (S91). Accordingly, the memory controller 30 receives data read from the read target region from the nonvolatile memory 10 using a read voltage different from the read voltage of the host read processing in S80 in FIG. 16.

The ECC circuit 34 of the memory controller 30 executes error detection processing and error correction processing concerning data received from the nonvolatile memory 10 in the read processing in S91. The ECC circuit 34 determines whether the correction of the error included in the data is successful in the error detection processing and the error correction processing (S92).

When failing in the correction of the error (S92; no), the memory controller 30 causes the nonvolatile memory 10 to execute read processing for the read target region based on an ID (a first intermediate ID) based on the anchor ID and the head ID (S93). Accordingly, the memory controller 30 receives data read from the read target region from the nonvolatile memory 10 using a read voltage different from the read voltage of the host read processing in S80 and the read processing in S91 in FIG. 16 and FIG. 17.

The ECC circuit 34 of the memory controller 30 executes error detection processing and error correction processing concerning the data received from the nonvolatile memory 10 in the read processing in S93. The ECC circuit 34 determines whether correction of an error included in the data is successful in the error detection processing and the error correction processing (S94).

When the memory controller 30 succeeds in the correction of the error of the read data based on the head ID or the first intermediate ID (S92; yes or S94; yes), the second retry processing ends (end).

When the read target region has been written after the anchor region (S90; no), the memory controller 30 causes the nonvolatile memory 10 to execute, based on the tail ID, read processing for the read target region (S95). Accordingly, the memory controller 30 receives data read from the read target region from the nonvolatile memory 10 using a read voltage different from the read voltage of the host read processing in S80 in FIG. 16.

The ECC circuit 34 of the memory controller 30 executes error detection processing and error correction processing concerning the data received from the nonvolatile memory 10 in the read processing in S95. The ECC circuit 34 determines whether correction of an error included in the data is successful in the error detection processing and the error correction processing (S96).

When failing in the correction of the error (S96; no), the memory controller 30 causes the nonvolatile memory 10 to execute read processing for the read target region based on the ID (the second intermediate ID) based on the anchor ID and the tail ID (S97). Accordingly, the memory controller 30 receives the data read from the read target region from the nonvolatile memory 10 using a read voltage different from the read voltage of the host read processing in S80 and the read processing in S95 in FIG. 16 and FIG. 17.

The ECC circuit 34 of the memory controller 30 executes error detection processing and error correction processing concerning the data received from the nonvolatile memory 10 in the read processing in S97. The ECC circuit 34 determines whether correction of an error included in the data is successful in the error detection processing and the error correction processing (S98).

When the memory controller 30 succeeds in the correction of the error of the read data based on the tail ID or the second intermediate ID (S96; yes or S98; yes), the second retry processing ends (end).

When the correction of all the errors of the read data based on the head ID and the first intermediate ID is unsuccessful (S92; no and S94; no) or when the correction of all the errors of the read data based on the tail ID and the second intermediate ID is unsuccessful (S96; no and S98; no), the memory controller 30 executes Vth tracking processing (S99).

The memory controller 30 causes the nonvolatile memory 10 to execute, for the read target region, read processing using a read voltage estimated by the Vth tracking processing in S99 (S100).

The ECC circuit 34 of the memory controller 30 executes error detection processing and error correction processing concerning the data received from the nonvolatile memory 10 in the read processing in S100. The ECC circuit 34 determines whether correction of an error included in the data is successful in the error detection processing and the error correction processing (S101).

When failing in the correction of the error (S101; no), the memory controller 30 determines that the error included in the data read from the read target region cannot be corrected (S102).

When the memory controller 30 succeeds in the correction of the error (S101; yes) or after the processing in S102, the second retry processing ends (end).

2.4.2 Specific Examples

Subsequently, specific examples of the second retry processing are explained.

In the following explanation, for convenience of explanation, the cell unit CU corresponding to a set of a word line WL$\alpha$ and a string unit SU$\beta$ is described as CU (WL$\alpha$, SU$\beta$).

In the second retry processing explained below, it is assumed that a region in the block BLK0 is a read target region. It is assumed that an anchor region in the block BLK0 is a cell unit CU (WL4, SU2) is assumed. It is assumed that order in which the write processing is executed for the block BLK0 is assumed is order such as cell units CU (WL0, SU0), CU (WL0, SU1), CU (WL0, SU2), CU (WL0, SU3), CU (WL1, SU0), CU (WL1, SU1), CU (WL1, SU2), . . . . In this case, a head region in the block BLK0 is a cell unit CU (WL0, SU0). A tail region in the block BLK0 is a cell unit CU (WL7, SU3).

An anchor ID, a head ID, and a tail ID of the block BLK0 are as in the block management information 21A illustrated in FIG. 11 (that is, the anchor ID=9, the head ID=3, and the tail ID=8).

First Example

FIG. 18 is a diagram illustrating a relation among a read target region, an anchor region, a head region, and a tail region in a first example of the second retry processing in the memory system according to the second embodiment. FIG. 19 is a diagram illustrating a relation among an intermediate ID, an anchor ID, a head ID, and a tail ID used in the first example of the second retry processing in the memory system according to the second embodiment. The first example corresponds to a case where the read target region is a cell unit CU (WL2, SU1).

As illustrated in FIG. 18, writing order of the cell unit CU (WL2, SU1) corresponding to the read target region is between a cell unit CU (WL0, SU0) corresponding to the head region and a cell unit CU (WL4, SU2) corresponding to the anchor region. Accordingly, the reading target region is written before the anchor region. Accordingly, the memory controller 30 executes the processing in S91 to S94 in the second retry processing illustrated in FIG. 17. That is, when failing in the correction of the data read based on the head ID, the memory controller 30 causes the nonvolatile memory 10 to execute the read processing based on the first intermediate ID.

As illustrated in FIG. 19, in various types of determination processing in the binary tree, the memory controller 30 sets, as the first intermediate ID, a compression value corresponding to a terminal node reached by a flow located between a flow reaching the anchor ID and a flow reaching the head ID. Specifically, a terminal node T9 corresponding to the anchor ID passes through nodes N1, N5, N6, and N8. A terminal node T3 corresponding to the head ID passes through the nodes N1 and N5. Accordingly, the memory controller 30 selects T6 located between the terminal nodes T9 and T3 as the terminal node corresponding to the first intermediate ID.

By selecting the first intermediate ID as explained above, it is possible to select a shift amount having an intermediate characteristic between a characteristic of a shift amount suitable for the read processing from the anchor region and a characteristic of a shift amount suitable for the read processing from the head region.

Second Example

FIG. 20 is a diagram illustrating a relation among a read target region, an anchor region, a head region, and a tail region in a second example of the second retry processing in the memory system according to the second embodiment. FIG. 21 is a diagram illustrating a relation among an intermediate ID, an anchor ID, a head ID, and a tail ID used in the second example of the second retry processing in the memory system according to the second embodiment. The second example corresponds to a case where the read target region is a cell unit CU (WL6, SU1).

As illustrated in FIG. 20, writing order of the cell unit CU (WL6, SU1) corresponding to the read target region is between a cell unit CU (WL4, SU2) corresponding to the anchor region and a cell unit CU (WL7, SU3) corresponding to the tail region. Accordingly, the read target region is written after the anchor region. Accordingly, the memory controller 30 executes the processing in S95 to S98 in the second retry processing illustrated in FIG. 17. That is, when failing in the correction of the data read based on the tail ID, the memory controller 30 causes the nonvolatile memory 10 to execute the read processing based on the second intermediate ID.

As illustrated in FIG. 21, in various types of determination processing in the binary tree, the memory controller 30 sets a compression value corresponding to a terminal node reached by a flow located between a flow reaching the anchor ID and a flow reaching the tail ID as a second intermediate ID. Specifically, a terminal node T9 corresponding to the anchor ID passes through nodes N1, N5, N6, and N8. The terminal node T8 corresponding to the tail ID passes through the nodes N1, N5, NG, and N7. Accordingly, the memory controller 30 selects T5 located between the terminal nodes T9 and T8 as the terminal node corresponding to the second intermediate ID.

By selecting the second intermediate ID as explained above, it is possible to select a shift amount having an intermediate characteristic between a characteristic of a shift amount suitable for the read processing from the anchor region and a characteristic of a shift amount suitable for the read processing from the tail region.

2.5 Effects According to the Second Embodiment

According to the second embodiment, if "true" is set in the time difference flag, the memory controller 30 executes the correction amount calculation processing based on the data read from the head region to derive the head ID. In the host read processing, if failing in the correction of the read data based on the anchor ID and the writing order of the read target region is between the anchor region and the head region, the memory controller 30 executes the read processing based on the head ID. Accordingly, a tendency of a shift amount applied to the host read processing can be brought close to a tendency of a shift amount of the head region. Therefore, if time when data is written in the read target region is closer to the head region than the anchor region, the number of fail bits included in data read from the read target region can be reduced.

When failing in the correction of the read data based on the head ID, the memory controller 30 derives a first intermediate ID having an intermediate characteristic between the head ID and the anchor ID. Accordingly, a tendency of a shift amount applied to the host read processing can be brought close to an intermediate tendency between a shift amount of the head region and a shift amount of the anchor region. Accordingly, if time when data is written in the read target region is close to the middle between time when data is written in the anchor region and time when data is written in the head region, the number of fail bits included in data read from the read target region can be reduced.

In the host read processing, when failing in the correction of the read data based on the anchor ID and the writing order of the read target region is between the anchor region and the tail region, the memory controller 30 executes the read processing based on the tail ID. Accordingly, a tendency of a shift amount applied to the host read processing can be brought close to a tendency of a shift amount of the tail region. Accordingly, in a case where time when data is written in the read target region is closer to the rear end region than the anchor region, the number of fail bits included in data read from the read target region can be reduced.

When failing in the correction of the read data based on the tail ID, the memory controller 30 derives a second intermediate ID having an intermediate characteristic between the tail ID and the anchor ID. Accordingly, a tendency of a shift amount applied to the host read processing can be brought close to an intermediate tendency between the shift amount of the tail region and the shift amount of the anchor region. Accordingly, in a case where time when data is written in the read target region is close to the middle between time when data is written in the anchor region and time when data is written in the tail region, the number of fail bits included in data read from the read target region can be reduced.

3. Others

The first embodiment and the second embodiment explained above are not limited to the examples explained above. Various modifications can be applied.

For example, in the first embodiment and the second embodiment explained above, a set of one anchor region and one anchor ID is allocated to one block BLK. However, the present invention is not limited to this. For example, a plurality of sets of anchor regions and anchor IDs may be allocated to one block BLK.

In the first embodiment and the second embodiment explained above, 3-bit data can be stored in one memory cell transistor MT. However, the present invention is not limited to this. The present invention is also applicable when 2-bit, 4-bit, or 5-bit or more data can be stored.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory including a plurality of blocks each including a plurality of cell units, each of the cell units including a plurality of memory cells; and
a memory controller,
wherein the memory controller is configured to
read second data from a second cell unit in a first block in response to first data being written in a first cell unit in the first block, and
reserve refresh processing for the first block when the second data satisfies a condition.

2. The memory system according to claim 1, wherein
each of the memory cells is configured to store a plurality of bits of data,
the second cell unit includes a plurality of data regions corresponding to a number of bits of data stored in each of the memory cells, and
the memory controller is configured to read the second data from at least one data region among the data regions of the second cell unit in response to the first data being written in the first cell unit.

3. The memory system according to claim 2, wherein the memory controller is configured to read the second data from all data regions among the data regions of the second cell unit in response to the first data being written in the first cell unit.

4. The memory system according to claim 1, wherein the second cell unit is a cell unit in which data is written first in the first block.

5. The memory system according to claim 1, wherein the first cell unit is a cell unit in which data is written last in the first block.

6. The memory system according to claim 1, wherein the memory controller is configured to write data written in the first block in a second block in the refresh processing for the first block.

7. The memory system according to claim 1, wherein the memory controller is configured to overwrite a part of data written in the first block over the first block in the refresh processing for the first block.

8. The memory system according to claim 1, wherein the condition includes a condition that a number of fail bits included in the second data is equal to or larger than a threshold.

9. The memory system according to claim 1, wherein the memory controller is configured to
calculate a first shift amount concerning a read voltage applied to a third cell unit based on third data read from the third cell unit in the first block,
in read processing from a fourth cell unit in the first block,
calculate, based on the first shift amount, a second shift amount concerning a read voltage applied to the fourth cell unit, and
read fourth data from the fourth cell unit based on the second shift amount.

10. The memory system according to claim 9, wherein the memory controller is configured to, when the second data satisfies the condition,
calculate, based on the second data, a third shift amount concerning a read voltage applied to the second cell unit, and
when failing in correction of a fail bit included in the fourth data in read processing from the fourth cell unit,
calculate, based on the third shift amount, a fourth shift amount concerning a read voltage applied to the fourth cell unit, and
read fifth data from the fourth cell unit based on the fourth shift amount.

11. The memory system according to claim 10, wherein the memory controller is configured to, when failing in correction of a fail bit included in the fifth data in read processing from the fourth cell unit,
calculate, based on the first shift amount and the third shift amount, a fifth shift amount concerning a read voltage applied to the fourth cell unit, and
read sixth data from the fourth cell unit based on the fifth shift amount.

12. The memory system according to claim 10, wherein the memory controller is configured to calculate the fourth shift amount and read the fifth data when writing order of the fourth cell unit in the first block is between the second cell unit and the third cell unit.

13. The memory system according to claim 9, wherein the memory controller is configured to, when the second data satisfies the condition,
read sixth data from the first cell unit based on the first shift amount,
calculate a sixth shift amount concerning a read voltage applied to the first cell unit based on the sixth data, and
when failing in correction of a fail bit included in the fourth data in read processing from the fourth cell unit,
calculate, based on the sixth shift amount, a seventh shift amount concerning a read voltage applied to the fourth cell unit, and
read seventh data from the fourth cell unit based on the seventh shift amount.

14. The memory system according to claim 13, wherein the memory controller is configured to, when failing in correction of a fail bit included in the seventh data in read processing from the fourth cell unit,
calculate, based on the first shift amount and the sixth shift amount, an eighth shift amount concerning a read voltage applied to the fourth cell unit, and
read eighth data from the fourth cell unit based on the eighth shift amount.

15. The memory system according to claim 13, wherein the memory controller is configured to calculate the seventh shift amount and read the seventh data when writing order of the fourth cell unit in the first block is between the first cell unit and the third cell unit.

16. The memory system according to claim 1, wherein each of the blocks is a data erasing unit.

* * * * *